United States Patent
Yamaguchi

(10) Patent No.: US 6,476,742 B2
(45) Date of Patent: Nov. 5, 2002

(54) EVALUATION SYSTEM FOR ANALOG-DIGITAL OR DIGITAL-ANALOG CONVERTER

(75) Inventor: Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/925,230

(22) Filed: Aug. 8, 2001

(65) Prior Publication Data

US 2002/0005794 A1 Jan. 17, 2002

Related U.S. Application Data

(62) Division of application No. 09/157,272, filed on Sep. 18, 1998.

(30) Foreign Application Priority Data

Sep. 18, 1997 (JP) .............................. 9-253565
Sep. 29, 1997 (JP) .............................. 9-263809

(51) Int. Cl.⁷ .......................... H03M 1/10; H03M 1/66
(52) U.S. Cl. ...................................... 341/120; 341/144
(58) Field of Search ............................... 341/120, 155, 341/116, 117, 122, 118, 144; 324/617, 73.1

(56) References Cited

U.S. PATENT DOCUMENTS 4,733,167 A * 3/1988 Tamamura .................. 341/120
6,177,894 B1 * 1/2001 Yamaguchi ................. 341/120
6,326,909 B1 * 12/2001 Yamaguchi ................. 341/120

* cited by examiner

Primary Examiner—Patrick Wamsley
(74) Attorney, Agent, or Firm—David N. Lathrop; Gallagher & Lathrop

(57) ABSTRACT

There is provided an evaluation system for an A-D converter or a D-A converter capable of evaluating factors of a compounded fault and measuring an effective number of bits with a high accuracy and with a reduced volume of computation, independently of a testing frequency. A sine wave signal is applied to an A-D converter under test. Maximal or minimal values of a cosine wave component and a sine wave component in the converted output are aligned. A square root of a sum of squares of samples is formed to determine an instantaneous amplitude. The amplitude of the sine wave signal is interleaved into the series of instantaneous amplitudes. A difference series for the interleaved instantaneous amplitude series is formed by digital moving differentiator means. Alternatively, a Wavelet transform is applied to the interleaved instantaneous amplitude series, and a maximum amplitude therein is detected by a peak finder, and the detected value is delivered as representing an estimated effective number of bits.

40 Claims, 25 Drawing Sheets

EVALUATION SYSTEM FOR ANALOG-DIGITAL OR DIGITAL-ANALOG CONVERTER

BACKGROUND OF THE INVENTION

1. Field of the Invention

The present invention relates to an evaluation system for evaluating the performance of an analog-digital converter (A-D converter) which converts an analog signal into a digital signal or a digital-analog converter (D-A converter) which converts a digital signal into an analog signal, and more particularly, to a performance evaluation system for evaluating the effective number of bits of an A-D converter or D-A converter which is implemented by a single semiconductor integrated circuit or a combination of a plurality of semiconductor integrated circuits.

2. Description of the Related Art

A method of evaluating an A-D converter (hereinafter, referred to as ADC) is categorized into a static characteristic evaluation method and a dynamic characteristic evaluation method. According to the static characteristic evaluation method, a precisely defined direct current (dc) voltage is applied to an ADC which is a device under test (DUT), and a response from the ADC is observed, and thereafter, "a difference between the transition voltage of an actual ADC and the transition voltage of an ideal ADC" is estimated in a computer or the like using the differential nonlinearity (DNL) or the like.

The differential nonlinearity (DNL) in this case is a result of the comparison of a difference (actual step width) between the upper limit amplitudes of an analog signal which causes an ADC to output adjacent quantized codes therefrom when applied to the ADC, with an ideal step width which corresponds to 1 LSB, and enables a localized fault or defect which depends on a particular code to be detected. That is, DNL for an ADC is defined as follows:

$$DNL = A_{in}(Q_{m+1}) - A_{in}(Q_m) - 1 [LSB] \quad (1)$$

where $Q_{m+1}$ and $Q_m$ are two adjacent quantized codes and $A_{in}(Q_n)$ is the upper limit of the amplitude of an analog signal which corresponds to the quantized code $Q_n$. For example, if "the difference between adjacent transition amplitudes" remains constant and equals the step size (width) corresponding to 1 LSB, then DNL is zero.

However, the static characteristic evaluation method cannot measure or determine the nonlinearity of an ADC which is a device under test which depends on the frequency of a signal to be applied to the ADC.

According to the dynamic characteristic evaluation method, a periodic signal is applied to an ADC which is a device under test, and a response from the ADC is observed, and thereafter, "a difference between the transition voltage of an actual ADC and the transition voltage of an ideal ADC" is estimated in a computer or the like.

This method has an advantage that a characteristic which closely approximates an actual operation of the ADC to be tested can be estimated. Particularly, dynamic characteristic evaluation techniques which utilize a sine wave (sinusoidal wave) as an input signal include a histogram approach, an FFT approach and a curve fitting approach as mentioned below.

(a) In the histogram approach, a histogram is plotted against each quantized code from a digital waveform of the response from the ADC. A difference between the histogram of an actual ADC and the histogram of an ideal ADC is then determined and divided by the histogram of the ideal ADC to estimate DNL. The normalization of the difference in the histograms or its division by the histogram of the ideal ADC accounts for a non-uniform distribution of the sine wave histogram.

(b) In the FFT approach, a digital signal representing the response of the ADC is Fourier transformed as by FFT (fast Fourier transform), and is separated in the frequency domain into a signal (namely, a frequency spectrum of the sine wave applied) and noises (namely, a spectrum of quantization noises or a sum of spectra other than the frequency of the sine wave applied), thus determining a signal-to-noise ratio (SNR).

For example, as shown in FIG. 17A, a sine wave signal from a sine wave generator 11 is passed through a low pass filter (LPF) 12 to eliminate unwanted components therefrom before it is fed to a sample-and-hold circuit 13 where the sine wave signal is sampled periodically and held therein for feeding to an ADC 14 under test. A response output from the ADC 14 is fed to an FFT unit 15 where it is subject to the fast Fourier transform to be transformed into a signal in the frequency domain, which is then fed to an SNR estimator 16. On the basis of a result of the FFT as illustrated in FIG. 17B, the SNR estimator 16 determines the signal-to-noise ratio SNR by dividing the sine waveform signal component $G_{ss}(f_0)$ by the noise component:

$$\sum_{f \neq f_0} G_{nn}(f)$$

If the quantization noise increases in the ADC 14 because of fault, the signal-to-noise ratio SNR is degraded, increasing the number of bits among the total number of bits in the ADC 14 which are influenced by the quantization noise. It is then possible to estimate the effective number of bits (ENOB) of the tested ADC on the basis of the signal-to-noise ratio observed. The effective number of bits (ENOB) of the tested ADC can be given by the following equation (2).

$$ENOB = \frac{SNR[dB] - 1.76}{6.02} [bits] \quad (2)$$

In this case, by changing the frequency $f_0$ of the sine wave signal applied, the frequency dependency of ENOB can be measured or determined.

(c) In the curve fitting approach using the sine wave, parameters (such as frequency, phase, amplitude, offset etc.) of an ideal sine wave are chosen so that the square error between a sampled digital signal and the ideal sine wave is minimized. An rms (root-mean-square) error determined in this manner is compared against the rms error of the ideal ADC having the same number of bits to estimate the effective number of bits.

Means for generating an analog signal such as a sine wave is described in detail in "Theory and Application of Digital Signal Processing" by Lawrence R. Rabiner and Bernard Gold; Prentice-Hall, 1975, in particular, "9.12: Hardware realization of a Digital Frequency Synthesizer", for example.

A problem with the use of the histogram approach mentioned in the above paragraph (a) to estimate the DNL of an ADC with a high precision is a very long time needed for the determination. By way of example, an estimation of the DNL for an 8-bit ADC with a reliability of 99% and for an interval width of 0.01 bit requires 268,000 samples. For a 12-bit ADC, as many as 4,200,000 samples are required. (See, for example, "Full-Speed Testing of A/D Converters" by Joey Doernberg, Hae-Seung Lee and David A. Hodges, IEEE Journal of Solid-State Circuits, Vol. SC-19, No. 6, pp. 820–827, 1984.) When the ADC under test exhibits hysteresis, it is likely that any fault therein cannot be detected by using the histogram approach.

Here it is assumed that when an input signal crosses a given level with a positive gradient, a corresponding code width is enlarged, increasing the number of observations, while when the input signal crosses the given level with a negative gradient, the corresponding code width shrinks, decreasing the number of observations.

According to the histogram approach, no distinction is made in the direction in which the input signal changes, and accordingly, the number of observations for the positive gradient and the number of observations for the negative gradient are added together in the number of observations. As a result, an increase and a decrease in the number of observations cancel each other, and the code width will be one close to a code width for a fault-free ideal ADC. (See, for example, "Classical Tests are inadequate for Modern High-Speed Converters" by Ray K. Ushani, Datel Application Notes AN-5, 1991.) As a consequence, the DNL which can be estimated with the histogram approach is a result of comparison of a difference in mean values of output code width against the ideal step size corresponding to 1 LSB. In addition, there must be a relationship other than an integral multiple between the frequency of the input sine wave and the sampling frequency of the ADC. (See, for example, the paper by Joey Doernberg, Hae-Seung Lee and David A. Hodges.)

A problem with the estimation of the effective number of bits by the FTT approach mentioned in the above paragraph (b) will be considered. To enable an accurate observation of the noise spectrum from the ADC under test using the FTT approach, it is necessary that the standard deviation $$\varepsilon[\hat{G}_{aa}] \approx \frac{1}{\sqrt{N}}$$

made sufficiently small. (See, for example, J. S. Bendat and A. G. Piersol, 1986.) The number of samples N must be increased at this end. When the number of samples is increased by a factor of 4, the noise level will be 6 dB lower. The computation of an FFT requires a number of real number multiplications, which is represented by $$N \cdot \log_2\left[\frac{N}{2}\right] - 4$$

and a number of real number additions, which is represented by:

$$3/2N \cdot (\log_2[N]+1) - 12$$

The ADC converts an analog signal into a digital output code in accordance with the amplitude of the input signal. If the Fourier transform of the output signal is used in evaluating the conversion characteristic of ADC, conversion defects that are localized in individual output codes cannot be separated. This is because defects present within different codes are added together as noise in calculating the rms error. Thus if there is no correlation between the defects and if different codes are influenced by them, these defects will be evaluated as "part of noise which coherently influences the same code." As a consequence, there is a likelihood that the number of effective bits may be underestimated. (See, for example, "Data-converters: Getting to know Dynamic Specs" by Robert E. Leonard Jr., Datel Application Notes AN-3.) At the same time, an analysis of individual factors which cause a reduction in the effective number of bits such as DNL, integral nonlinearity (INL), aperture jitter or noise is prohibited. Thus, the effective number of bits which can be estimated by this approach is not an instantaneous value which corresponds to each output code, but is a mean value determined over the entire output codes. Moreover, there is a need to provide a relationship other than an integral multiple between the frequency of the input sine wave and the sampling frequency of the ADC in order to randomize the quantization error. (See, for example, "Integrated Analog-to-Digital and Digital-to-Analog Converters" by Rudy van der Plassche, Kluwer Academic Publishers, 1994.)

Finally, a problem with the curve fitting approach mentioned in the above paragraph (c) will be considered. With this approach, it is necessary to estimate the parameters of the ideal sine wave by the method of least squares.

(1) To estimate the frequency of the ideal sine wave, the Fourier transform takes place only for a single presumed frequency to determine the power. When the power reaches a maximal value, the frequency is estimated. The maximal value cannot be found unless the frequency estimation is repeated at least three times. Thus, this requires 9N (where N represents the number of samples) real number multiplications and (6N−3) real number additions.

(2) The estimation of the phase requires 2N real number multiplications, (2N−2) real number additions, one real number division and one calculation of arctangent.

(3) The estimation of the amplitude requires 2N real number multiplications, (2N−2) real number additions and one real number division.

Where the operation of the ADC under test largely departs from its normal operation or where the digital waveform from the ADC under test contains a reduced number of samples, the square error does not approach a given value if the calculation of the square error is effected while changing the parameter of the sine wave. Thus, the error diverges rather than converges. To give an example, since the variance of the frequency estimate is proportional to $1/N^3$, a sufficiently great number of samples, in excess of 4096 samples, are necessary to suppress the variance. The effective number of bits which can be estimated by this approach corresponds again to a mean value determined over the entire output codes. As a consequence, an analysis of individual factors such as harmonic distortion, noise or aperture jitter which causes a reduction in the effective number of bits is prohibited. In addition, there must be a relationship other than an integral multiple between the frequency of the input sine-wave and the sampling frequency of the ADC. If the sampling frequency were an integral multiple of the frequency of the input sine wave, the input signal would become coherent to the sampling, with consequence that only a specific quantization level would be tested. (See, for example, the paper by Ray K. Ushani.)

Problems with the prior art techniques for evaluation of dynamic characteristics of the ADC can be summarized as the following:

The DNL or the effective number of bits estimated according to any technique represents a mean value rather than an instantaneous value. Accordingly, it is difficult to estimate independently factors of a compounded fault. In the process of estimating the effective number of bits for an ADC which uses a sine wave as an input signal, a relationship other than an integral multiple must be established between the frequency of the input sine wave and the sampling frequency of the ADC. For this reason, an arbitrary frequency cannot be selected as the testing frequency. In addition, a very large number of samples are required for any technique chosen. Assuming a number of samples equal to 512, the volume of computation needed is as follows:

FFT approach: 4092 real number multiplications and 7668 real number additions;

curve fitting approach: 6656 real number multiplications and 4092 real number additions.

Like the case of the ADC, the method of evaluating the performance of a D-A converter (hereinafter, referred to as DAC) is also categorized into a static characteristic evaluation method and a dynamic characteristic evaluation method. According to the static characteristic evaluation method, a ramp waveform digital signal pattern is applied to a DAC which is a device under test (DUT), and a response from the DAC is observed, and thereafter, "a difference between the transition voltage of an actual DAC and the transition voltage of an ideal DAC" is estimated in a computer or the like using the differential nonlinearity (DNL) or the like.

The differential nonlinearity (DNL) in this case is a result of the comparison of a difference in the analog outputs (actual step width) as adjacent digital codes are input to the DAC against an ideal step width which corresponds to 1 LSB, and permits a localized defect which depends on a particular code to be detected. That is, DNL for the DAC is defined as follows:

$$DNL = S_{out}(C_{m+1}) - S_{out}(C_m) - 1[LSB] \quad (3)$$

where $C_{m+1}$ and $C_m$ are two adjacent digital codes which are inputted to the DAC, and $S_{out}(C_n)$ represents an analog output signal corresponding to the digital code $C_n$. For example, if all of "the difference between analog outputs for adjacent digital codes" remain constant and equal the step size (width) corresponding to 1 LSB, then DNL equals to zero.

However, the static characteristic evaluation method cannot measure or determine the nonlinearity of a DAC, which depends on the frequency of a signal to be applied to the DAC.

According to the dynamic characteristic evaluation method, a periodic signal is applied to a DAC which is a device under test, and a response from the DAC is observed, and thereafter, "a difference between the transition voltage of an actual DAC and the transition voltage of an ideal DAC" is estimated in a computer or the like.

This method has an advantage that a characteristic which closely approximates an actual operation of the DAC to be tested can be estimated. In a similar manner to the case of the ADC, dynamic characteristic evaluation techniques which utilize a sine wave (sinusoidal wave) as an input signal particularly include a histogram approach, an FFT approach and a curve fitting approach mentioned below.

(a) In the histogram approach, a histogram is plotted against each quantized code from an analog waveform of the response from the DAC, which is digitalized by a high precision ADC. A difference between the histogram of an actual DAC and the histogram of an ideal DAC is then determined and is then divided by the histogram of the ideal DAC to estimate DNL. A normalization of the difference in the histograms by its division by the histogram of the ideal DAC accounts for a non-uniform distribution of the sine wave histogram.

(b) In the FFT approach, an analog waveform representing the response of the DAC is digitalized with a high precision ADC and subjected to a Fourier transform as by FFT, and is separated in the frequency domain into a signal (namely, a frequency spectrum of the sine wave applied) and noises (namely, a sum of spectra other than sine wave applied), thus determining a signal-to-noise ratio (SNR).

For example, as shown in FIG. 25, a digital signal of a sine wave from a pattern generator 111 is applied to a DAC under test (DUT) 112, and an analog signal delivered from the DAC 112 is supplied to a high precision ADC 113, which converts it into a digital signal of a high precision. This digital signal is fed to an FFT unit 114 where a fast Fourier transform takes place to transform it into a signal in a frequency domain, whereupon it is fed to an SNR (signal-to-noise ratio) estimator 115. On the basis of a result of the FFT as illustrated in FIG. 17B, the SNR estimator 115 determines the signal-to-noise ratio SNR by dividing the sine wave signal component $G_{ss}(f_0)$ applied to the DAC 112 by the noise component:

$$\sum_{f \ne f_0} G_{nn}(f)$$

If the quantization noise or conversion error increases in the DAC 112 because of fault, the signal-to-noise ratio SNR is degraded, increasing the number of bits among the total number of bits in the DAC 112 which are influenced by the quantization noise or conversion error. It is then possible to estimate the effective number of bits (ENOB) of the tested DAC on the basis of the signal-to-noise ratio observed. The effective number of bits (ENOB) of the DAC can be given by the following equation (4).

$$ENOB = \frac{SNR[dB] - 1.76}{6.02} [bits] \quad (4)$$

In this case, by changing the frequency $f_0$ of the sine wave signal applied, the frequency dependency of ENOB can be measured or determined.

(c) In the curve fitting approach with the sine wave, parameters (such as frequency, phase, amplitude or offset) of an ideal sine wave are chosen so that the square error between a sampled digital signal and the ideal sine wave is minimized. An rms (root-mean-square) error determined in this manner is compared against the rms error of the ideal DAC having the same number of bits to estimate the effective number of bits.

Means for generating an analog signal such as a sine wave is described in detail in "Theory and Application of Digital Signal Processing" by Lawrence R. Rabiner and Bernard Gold; Prentice-Hall, 1975, in particular, "9.12: Hardware realization of a Digital Frequency Synthesizer", for example. By substituting a digital fitter for the analog filter shown in this literature, distortion components in the sine wave can be eliminated.

A problem with the use of the histogram approach mentioned in the above paragraph (a) to estimate the DNL of a DAC with a high precision is a very long time needed for the determination. By way of example, an estimation of the DNL for an 8bit DAC with a reliability of 99% and for an interval width of 0.01 bit requires 268,000 samples. For a 12-bit DAC, as many as 4,200,000 samples are required. (See, for example, "Full-Speed Testing of A/D Converters" by Joey Doernberg, Hae-Seung Lee and David A. Hodges, IEEE Journal of Solid-State Circuits, Vol. SC-19, No. 6, pp.

820–827, 1984.) When the DAC under test has hysteresis, it is likely that any fault therein cannot be detected by using the histogram approach.

Here it is assumed that when an input signal crosses a given level with a positive gradient, a corresponding code width is enlarged, increasing the number of observations, while when the input signal crosses the given level with a negative gradient, the corresponding code width shrinks, decreasing the number of observations.

According to the histogram approach, no distinction is made in the direction in which the input signal changes, and accordingly, the number of observations for the positive gradient and the number of observations for the negative gradient are added together in the number of observations. Hence, an increase and a decrease in the number of observations cancel each other, and the code width will be one close to a code width for a fault-free ideal DAC. (See, for example, "Classical Tests are inadequate for Modern High-Speed Converters" by Ray K. Ushani, Datel Application Notes AN-5, 1991.) As a consequence, the DNL which can be estimated with the histogram approach is a result of comparison of a difference in mean values of output code widths against the ideal step size corresponding to 1 LSB. In addition, there must be a relationship other than an integral multiple between the frequency of the input sine wave and the sampling frequency of the DAC. (See, for example, the cited paper by Joey Doernberg, Hae-Seung Lee and David A. Hodges.)

A problem with the estimation of the effective number of bits by the FTT approach mentioned in the above paragraph (b) will be considered. To enable an accurate observation of the noise spectrum from the DAC under test using the FTT approach, it is necessary that the standard deviation $$\varepsilon[\hat{G}_{aa}] \approx \frac{1}{\sqrt{N}}$$

be made sufficiently small. (See, for example, J. S. Bendat and A. G. Piersol, 1986.) The number of samples N must be increased at this end. When the number of samples is increased by a factor of 4, the noise level will be 6 dB lower. The computation of FFT requires a number of real number multiplications, which is represented by:

$$N \cdot \log_2\left[\frac{N}{2}\right] - 4$$

and a number of real number additions, which is represented by:

$$3/2N \cdot (\log_2[N]+1)-12$$

The DAC converts a digital code in the input signal into an analog signal for delivery. If the Fourier transform of the output signal is used in evaluating the conversion characteristic of DAC conversion defects that are localized in individual input codes cannot be separated. This is because defects which correspond to respective different codes only will be added together as noise in calculating the rms error. Thus even if there is no correlation between the defects and if different analog signal level in the output are influenced by them, these defects will be evaluated as "part of the noise which coherently influences the same analog signal". As a consequence, there is a likelihood that the number of effective bits may be underestimated. (See, for example, "Data converters: Getting to know Dynamic Specs" by Robert E. Leonard Jr., Datel Application Notes AN-3.) At the same time, an analysis of individual factors which cause a reduction in the effective number of bits such as DNL, integral nonlinearity (INL), glitch or noise is prohibited. Thus, the effective number of bits which can be estimated by this approach is not an instantaneous value which corresponds to each input code, but is a mean value determined over the entire output codes. Moreover, there is a need to provide a relationship other than an integral multiple between the frequency of the input sine wave and the sampling frequency of the DAC in order to randomize the conversion error. (See, for example, "Integrated Analog-to-Digital and Digital-to-Analog Converters" by Rudy van der Plassche, Kluwer Academic Publishers, 1994.)

Finally, a problem with the curve fitting approach mentioned in the above paragraph (c) will be considered. With this approach, it is necessary to estimate the parameter of the ideal sine wave by the method of least squares.

(1) To estimate the frequency of the ideal sine wave, the Fourier transform takes place only for a single presumed frequency to determine the power. When the power reaches a maximal value, the frequency is estimated. The maximal value cannot be found unless the frequency estimation is repeated at least three times. Thus, this requires 9N (where N represents the number of samples) real number multiplications and (6N−3) real number additions.

(2) The estimation of the phase requires 2N real number multiplications, (2N−2) real number additions, one real number division and one calculation of arctangent.

(3) The estimation of the amplitude requires 2N real number multiplications, (2N−2) real number additions and one real number division.

Where the operation of the DAC under test largely departs from its normal operation or where the analog waveform from the DAC under test contains a reduced number of samples, the square error does not approach a given value if the calculation of the square error is repeated while changing the parameter of the sine wave. Thus, the error diverges rather than converges. To give an example, since the variance of the frequency estimate is proportional to $1/N^3$, a sufficiently great number of samples, in excess of 4096 samples, are necessary to suppress the variance. The effective number of bits which can be estimated by this approach also corresponds to a mean value determined over the entire input codes. As a consequence, an analysis of individual factors such as harmonic distortion, noise or glitch which causes a reduction in the effective number of bits is prohibited. In addition, there must be a relationship other than an integral multiple between the frequency of the input sine wave and the sampling frequency of the ADC. If the sampling frequency were an integral multiple of the frequency of the input sine wave, the input signal would be coherent to the sampling, with consequence that only a specific quantization level would be tested. (See, for example, the paper by Ray K. Ushani.)

Problems with the prior art technique for evaluation of dynamic characteristics of the DAC can be summarized as follows:

The DNL or the effective number of bits estimated according to any technique represents a mean value rather than an instantaneous value. Accordingly, it is difficult to estimate independently factors of a compounded fault. In the process of estimating the effective number of bits for a DAC which uses a sine wave as an input signal, a relationship other than an integral multiple must be established between the frequency of the input sine wave and the sampling frequency of the DAC. For this reason, an arbitrary frequency cannot be selected as the testing frequency. In addition, a very large number of samples are required for any technique chosen. Assuming a number of samples equal to 512, the volume of computation needed is as follows:

FFT approach: 4092 real number multiplications and 7668 real number additions;

curve fitting approach: 6656 real number multiplications and 4092 real number additions.

SUMMARY OF THE INVENTION

It is a first object of the present invention to provide an ADC evaluation system which is capable of independently dealing with individual factors of a compounded fault and of enabling an estimation of an instantaneous effective number of bits.

It is a second object of the present invention to provide a system for evaluation of an effective number of bits of an ADC which permits an arbitrary choice of a testing frequency.

It is a third object of the present invention to provide a system for evaluating the effective number of bits of an ADC which can be implemented by simple hardware.

It is a fourth object of the present invention to provide an ADC evaluation system which is capable of estimating the effective number of bits with high accuracy without increasing the length of testing time.

It is a fifth object of the present invention to provide an ADC evaluation system capable of observing an instantaneous effective number of bits as a function of time.

It is a sixth object of the present invention to provide a DAC evaluation system which is capable of independently dealing with individual factors of a compounded fault and enabling an estimation of an instantaneous effective number of bits.

It is a seventh object of the present invention to provide a system for evaluating the effective number of bits for DAC in which an arbitrary choice of a testing frequency is allowed.

It is an eighth object of the present invention to provide a system for evaluating the effective number of bits of a DAC which can be implemented by simple hardware.

It is a ninth object of the present invention to provide a DAC evaluation system which is capable of estimating the effective number of bits with high accuracy without increasing the length of testing time.

It is a tenth object of the present invention to provide a DAC evaluation system which permits an instantaneous observation of an effective number of bits as a function of time.

In order to accomplish the above objects, in the first aspect of the present invention, there is provided an evaluation system for an A-D converter comprising: a signal generator for generating an analog signal corresponding to a sine wave; a timing controller for generating a clock which is used in supplying an analog signal to an A-D converter under test; a waveform memory for storing and accumulating a digital signal outputted from the A-D converter; instantaneous amplitude calculation means for taking out a digital signal stored in the waveform memory therefrom and determining an instantaneous amplitude; interleave signal producing means for receiving the instantaneous amplitude and the amplitude of the sine wave as its inputs and forming an interleave signal in which the instantaneous amplitude and the amplitude of the sine wave are interleaved;.and digital moving differentiator means for receiving the interleave signal as its input and calculating a moving difference.

In the second aspect of the present invention, there is provided an evaluation system for an A-D converter comprising: a signal generator for generating an analog signal corresponding to a sine wave; a timing controller for generating a clock which is used in supplying an analog signal to an A-D converter under test; a waveform memory for storing and accumulating a digital signal outputted from the A-D converter; instantaneous amplitude calculation means for taking out a digital signal stored in the waveform memory therefrom and determining an instantaneous amplitude; interleave signal producing means for receiving the instantaneous amplitude and the amplitude of the sine wave as its inputs and forming an interleave signal in which the instantaneous amplitude and the amplitude of the sine wave are interleaved; and Wavelet transform means-for receiving the interleave signal as its input and applying a Wavelet transform to the interleave signal.

The evaluation system for an A-D converter may further comprise a digital signal selecting means for selecting and taking out from the waveform memory either a digital signal that corresponds to a cosine wave or a digital signal the applied signal of which corresponds to a sine wave.

The waveform memory may include a plurality of waveform memories for storing and accumulating the digital signal, and the evaluation system for an A-D converter may further comprise: selecting means for selecting a waveform memory which stores and accumulates therein a digital signal corresponding to a cosine wave or a digital signal corresponding to a sine wave; and read-out means for selecting a waveform memory to read out the digital signal stored and accumulated therein.

The evaluation system for an A-D converter may further comprise: a trigger circuit coupled to a write circuit for the waveform memory and generating a trigger signal under a specified condition of an input digital signal; and control means for taking in a given quantity of digital signals on the basis of the trigger signal from the trigger circuit.

The instantaneous amplitude calculation means may comprise: multiplication means for reading a plurality of digital signals from the waveform memory to derive a square signal of a digital signals corresponding to the cosine wave and a square signal of a digital signal corresponding to the sine wave; adder means for adding a plurality of square signals to derive a square amplitude signal; and square root means for forming a square root of the square amplitude signal to determine an instantaneous amplitude signal.

The digital moving differentiator means may further comprise a combination of absolute value calculating means for determining an absolute value of a difference signal and maximum value detecting means for receiving an absolute value signal as its input and detecting the maximum value thereof.

The digital moving differentiator means may further comprise: a period memory which stores the period of a sine wave being applied to the A-D converter; and a combination of absolute value calculating means for determining an absolute value of a difference signal, and maximum value detecting means for receiving an absolute value signal as its input and detecting a-maximal value thereof in correspondence to the period of the sine wave.

The Wavelet transform means may further comprise a combination of absolute value calculating means for determining an absolute value of a signal obtained as a result of the Wavelet transform, and maximum value detecting means for receiving an absolute value signal as its input and detecting the maximum value thereof.

The Wavelet transform means may further comprise: a period memory which stores the period of a sine wave being applied to the A-D converter; and a combination of absolute value calculating means for determining an absolute value of a signal obtained as a result of the Wavelet transform, and maximal value detecting means for receiving an absolute value signal as its input and detecting a maximal value thereof in correspondence to the period of the sine wave.

In the third aspect of the present invention, there is provided an evaluation system for a D-A converter comprising: a pattern generator for generating a sine wave pattern in the form of a digital signal; a timing controller for generating a clock which is used in supplying the sine wave pattern to a D-A converter under test; an A-D converter having a higher accuracy of conversion than the D-A converter and operative to convert an analog signal outputted from the D-A converter to a digital signal; a waveform memory for storing and accumulating a digital signal outputted from the A-D converter; instantaneous amplitude calculation means for taking out a digital signal stored in the waveform memory therefrom and determining an instantaneous amplitude; interleave signal producing means for receiving the instantaneous amplitude and the amplitude of the sine wave as its inputs and forming an interleave signal in which the instantaneous amplitude and the amplitude of the sine wave are interleaved; and digital moving differentiator means for receiving the interleave signal as its input and calculating a moving difference.

In the fourth aspect of the present invention, there is provided an evaluation system for a D-A converter comprising: a pattern generator for generating a sine wave pattern in the form of a digital signal; a timing controller for generating a clock which is used in supplying the sine wave pattern to a D-A converter under test; an A-D converter having a higher accuracy of conversion than the D-A converter and operative to convert an analog signal outputted from the D-A converter to a digital signal; a waveform memory for storing and accumulating a digital signal outputted from the A-D converter; instantaneous amplitude calculation means for taking out a digital signal stored in the waveform memory therefrom and determining an instantaneous amplitude; interleave signal producing means for receiving the instantaneous amplitude and the amplitude of the sine wave as its inputs and forming an interleave signal in which the instantaneous amplitude and the amplitude of the sine wave are interleaved; and Wavelet transform means for receiving the interleave signal as its input and applying a Wavelet transform to the interleave signal.

The evaluation system for a D-A converter may further comprise a digital signal selecting means for selecting and taking out from the waveform memory either a digital signal that corresponds to a cosine wave or a digital signal that corresponds to a sine wave.

The waveform memory may include a plurality of waveform memories for storing and accumulating the digital signal, and the evaluation system for a D-A converter may further comprise: selecting means for selecting a waveform memory which stores and accumulates therein a digital signal pattern corresponding to a cosine wave or a digital signal pattern corresponding to a sine wave; and read-out means for selecting a waveform memory to read out the digital signal stored and accumulated therein.

The evaluation system for a D-A converter may further comprise: a trigger circuit coupled to a write circuit for the waveform memory and generating a trigger signal under a specified condition of an input digital signal pattern, and control means for taking in a given quantity of digital signals on the basis of the trigger signal from the trigger circuit.

The instantaneous amplitude calculation means may comprises: multiplication means for reading a plurality of digital signals from the waveform memory to derive a square signal of a digital signals corresponding to the cosine wave and a square signal of a digital signal corresponding to the sine wave; adder means for adding a plurality of square signals to derive a square amplitude signal; and square root means for forming a square root of the square amplitude signal to determine an instantaneous amplitude signal.

The digital moving differentiator means may further comprise a combination of absolute value calculating means for determining an absolute value of a difference signal and maximum value detecting means for receiving an absolute value signal as its input and detecting the maximum value thereof.

The digital moving differentiator means may further comprise: a period memory which stores the period of a sine wave being applied to the D-A converter; and a combination of absolute value calculating means for determining an absolute value of a difference signal, and maximum value detecting means for receiving an absolute value signal as its input and detecting a maximal value thereof in correspondence to the period of the sine wave.

The Wavelet transform means may further comprise a combination of absolute value calculating means for determining an absolute value of a signal obtained as a result of the Wavelet transform, and maximum value detecting means for receiving an absolute value signal as its input and detecting the maximum value thereof.

The Wavelet transform means may further comprise: a period memory which stores the period of a sine wave being applied to the D-A converter; and a combination of absolute value calculating means for determining an absolute value of a signal obtained as a result of the Wavelet transform, and maximal value detecting means for receiving an absolute value signal as its input and detecting a maximal value thereof in correspondence to the period of the sine wave.

DETAILED DESCRIPTION OF THE PREFERRED EMBODIMENTS

The technique of employing a Fourier transform which represents a mean square estimator or the curve fitting technique which employs the method of least squares cannot accomplish the first, the second and the third object of the present invention mentioned above. To accomplish these objects, separate means are necessary which are capable of separating non-idealities which are localized in respective output codes of an ADC.

Figure 1:
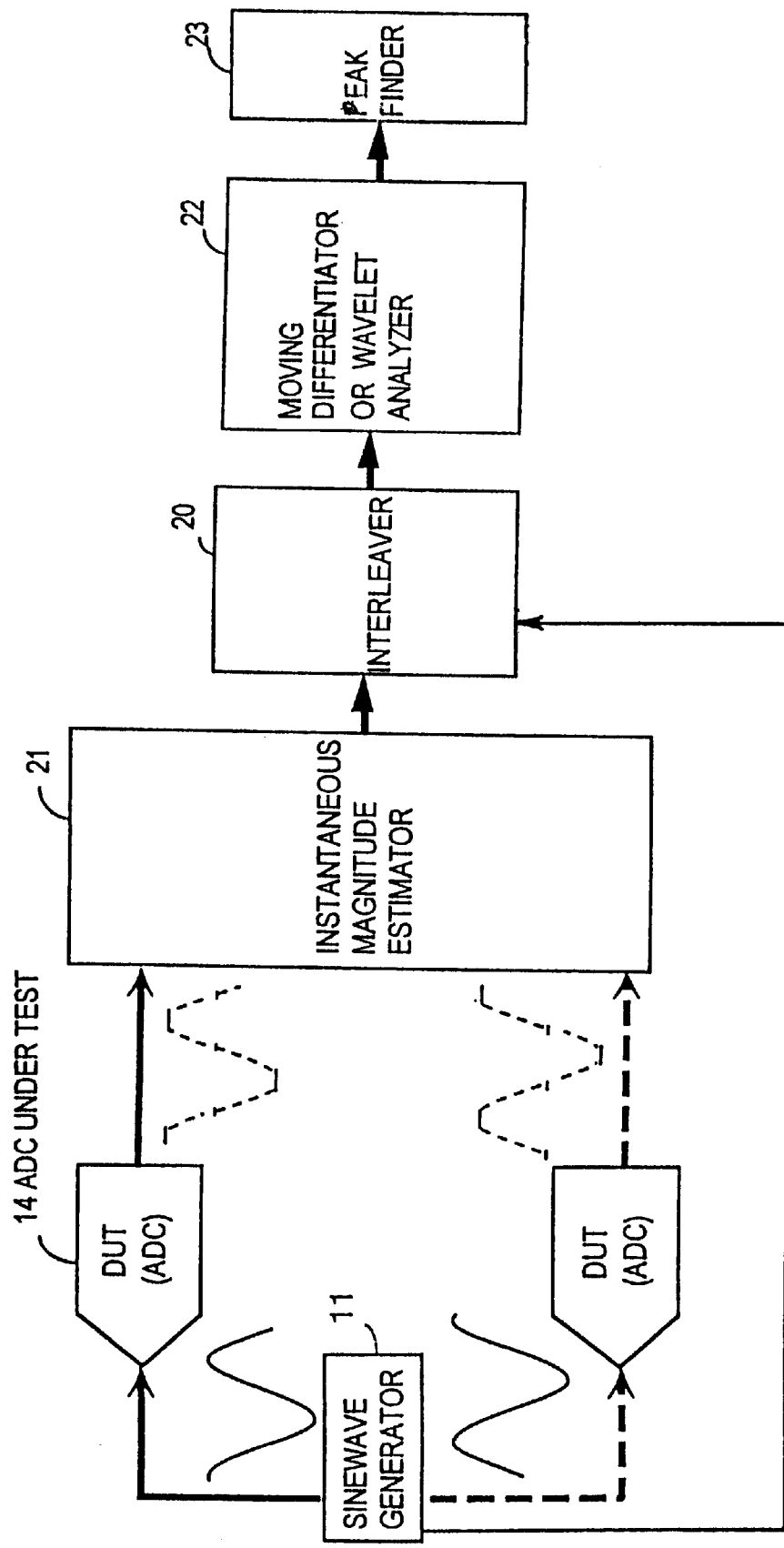
FIG. 1 is a block diagram illustrating the principle of an ADC evaluation system according to the present invention.

To provide means which are capable of separating non-linearities in accordance with the present invention, an instantaneous magnitude estimator 21 which receives a digital signal comprising output codes from an ADC as an input signal is used, as shown in FIG. 1.

As is discussed above, in the prior art practice, a combination of a Fourier transform unit and an SNR estimator is used to estimate indirectly a mean effective number of bits from an ADC under test. Instead of using such a combination of Fourier transform unit and the SNR estimator, the mean effective number of bits from an ADC under test is directly estimated in accordance with the present invention by using a combination of instantaneous magnitude estimator 21, an interleaver 20 and a digital moving differentiator or Wavelet transform unit 22, and a peak (extreme value, or the maximum value) finder 23.

Specifically, as shown in FIG. 1, in accordance with the present invention, a sine wave from a sine wave generator 11 is applied to an ADC 14 under test, and an instantaneous amplitude of the output from the ADC 14 is calculated by an instantaneous magnitude estimator 21. The calculated instantaneous amplitude and a known amplitude of the input sine wave are fed to an interleaver 20, which produces an interleaved signal. The interleaved signal from the interleaver 20 is supplied to a moving differentiator or Wavelet transform unit 22 for processing therein. An absolute magnitude and a maximum value of the output from the moving differentiator or Wavelet transform unit 22 is detected by a peak finder 23, and is used to determine the instantaneous effective number of bits for the ADC 14 under test.

As mentioned previously, the FFT technique or the curve fitting technique cannot directly determine non-idealities which are localized in respective localized codes of the ADC under test. For example, in the FFT technique, a digital signal comprising output codes from the ADC is subject to a Fourier transform, and a line spectrum which corresponds to an ideal sine wave in the frequency domain is estimated. A difference spectrum corresponding to the spectrum determined by the Fourier transform from which the line spectrum is estimated is then determined. Finally, the difference spectrum is made to correspond to non-idealities in the ADC under test.

Similarly, when the curve fitting approach is used, a calculation is repeated so that a square error between a sampled digital waveform and an ideal sine wave is minimized, thus estimating the ideal sine wave. Non-idealities in-the ADC under test are estimated by a differential vector between the vector of the sampled digital waveform and the vector of the ideal sine wave.

By contrast, in accordance with the present invention, the use of the instantaneous amplitude estimator 21 allows non-idealities in the respective output codes in the ADC under test to be determined directly. To simplify the description, it is assumed that the input signal comprises a cosine wave. A response digital waveform $\hat{X}[n]$ representing the response from the ADC under test is a sum of the input cosine wave and non-idealities e[n] such as quantization error of the ADC under test and the like.

$$\hat{X}[n]=A\cdot\cos(2\pi f_0 n+\Phi)+e[n] \tag{5}$$

The response digital signal showing the response of the ADC under test in correspondence to the input cosine wave always contains a sine wave X̂[m] which is related to the cosine wave and a Hilbert transform.

$$\hat{X}[m]=H(X[n])+e[m]=A\cdot\sin(2\pi f_0 n+\Phi)+e[m] \quad (6)$$

When both X̂[n] and X̂[m] are inputted to the instantaneous magnitude estimator 21, the instantaneous magnitude or amplitude z(n) is calculated and delivered.

$$z(n) \equiv \sqrt{\hat{X}[n]^2 + \hat{X}[m]^2} \quad (7)$$
$$\cong A + \{e[n]\cdot\cos(2\pi f_0 n + \Phi) + e[m]\cdot\sin(2\pi f_0 n + \Phi)\}$$

Figure 2A:
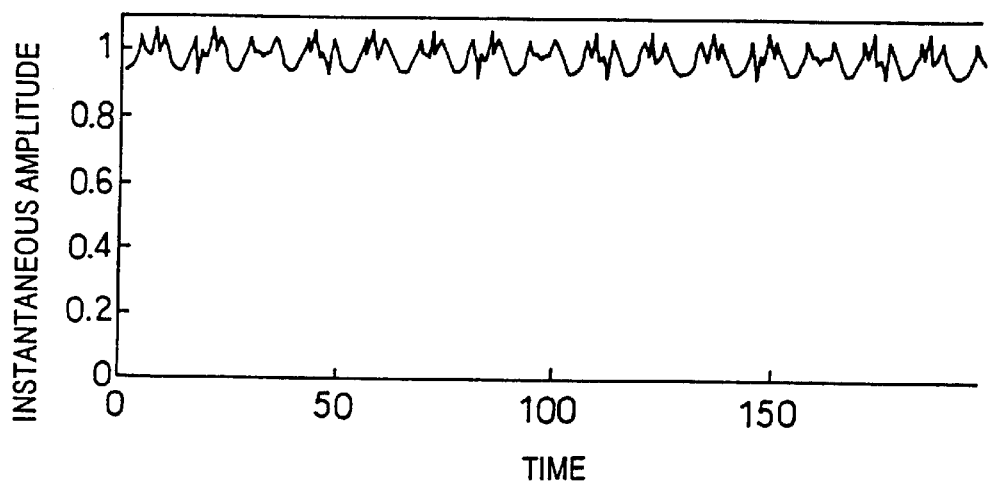
FIG. 2A is a diagram showing an instantaneous amplitude which is estimated from an output from a 4-bit ADC.

For an ideal ADC having an infinite number of bits, e[n] or e[m] is equal to zero, thus providing an envelope of a given amplitude. Conversely, an ADC under test which has a finite number of bits has an envelope of an error signal as shown in FIG. 2A. This may be regarded as having carrier waves represented by the cosine wave and the sine wave in the input signal which are amplitude modulated in accordance with the non-idealities e[n] or e[m] of the ADC under test. Accordingly, information representing the fault of the ADC under test appears in the amplitude modulation term of the equation (7).

In the dynamic performance test of the ADC under test, it is of greater importance to evaluate the worst value of the effective number of bits rather than the mean value of the effective number of bits. A maximum value or a minimum value of the amplitude modulation signal which is given by the equation (7) may be utilized in the estimation of the worst value of the effective number of bits.

$$-\Delta/2 < e[n] < \Delta/2 \quad (8\text{-}1)$$

Thus, a range of the amplitude modulation signal is given as follows:

$$A - \sqrt{2(\Delta/2)} < z(n) < A + 2(\Delta/2) \quad (8\text{-}2)$$

When evaluating the worst value of the effective number of bits of ADC under test, a maximal value and a minimal value of the amplitude modulation signal given by the equation (7) may be utilized to determine the instantaneous value of the effective number of bits which corresponds to the period of input sine wave. For example, the aperture jitter is proportional to a gradient in the input signal to the ADC. On the other hand, noises occur without any correlation with the input signal. Accordingly, by seeing if the fault which appears in the amplitude modulation signal is periodic, remains constant, or comprises substantially constant noise on which a periodic pattern is superimposed, it is possible to determine if a single fault or a compounded fault prevails.

In this manner, the instantaneous magnitude estimator used in accordance with the present invention enables a direct determination of non-idealities which are localized in the respective output codes of the ADC under test.

Assuming that a number of samples is equal to 512, then the volume of computation required will be as follows:
 FFT approach: 4092 real number multiplications and 7668 real number additions; and
 curve fitting approach: 6656 real number multiplications and 512 real number additions;
as mentioned previously, whereas in the instantaneous magnitude estimator, the required volume of computation will be as follows:
 1024 real number multiplications and 512 real number additions.

In this manner, the instantaneous magnitude estimator used in accordance with the present invention is effective to provide a system which accomplishes the first, the second and the third objects mentioned above.

The function and the effect of the digital moving differentiator 22 which is used in the present invention will be described.

Figure 2B:
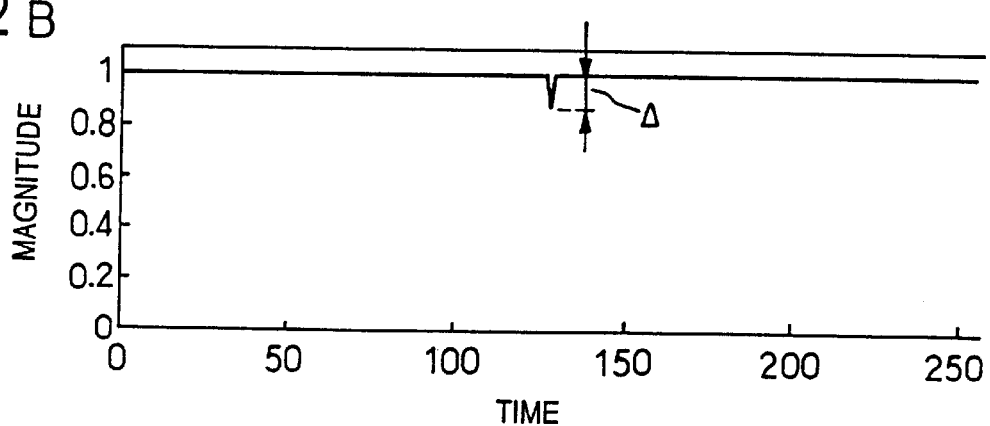
FIG. 2B is a diagram showing a single pulse signal.
Figure 2C:
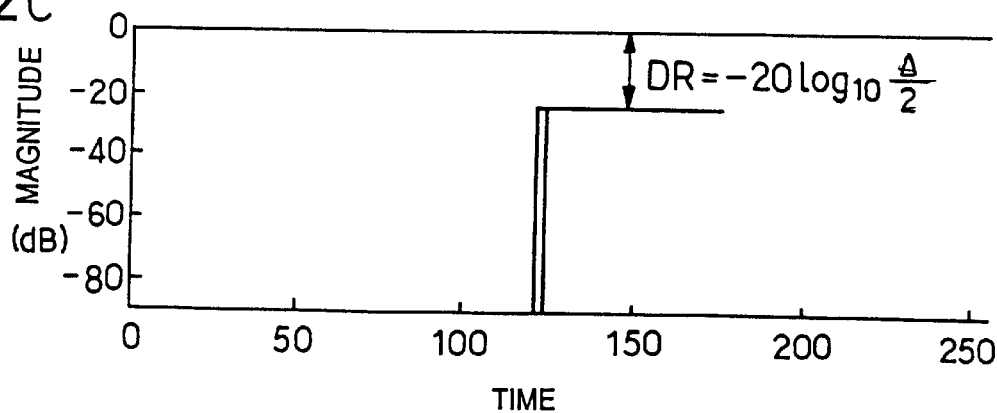
FIG. 2C is a diagram showing an output from a digital moving differentiator in response to the single pulse signal shown in FIG. 2B as an input.

A single pulse signal $1-\Delta\delta(t-\tau T)$ having an amplitude of a quantization step width $\Delta$ (FIG. 2B) is inputted to the digital moving differentiator 22, and only 512 samples are sampled. The impulse signal having an amplitude of the quantization step width $\Delta$ corresponds to an output code from the ADC. As shown in FIG. 2C, $-20\log_{10}(\Delta/2)$ which is proportional to the quantization step width of the ADC is observable.

Figure 3A:
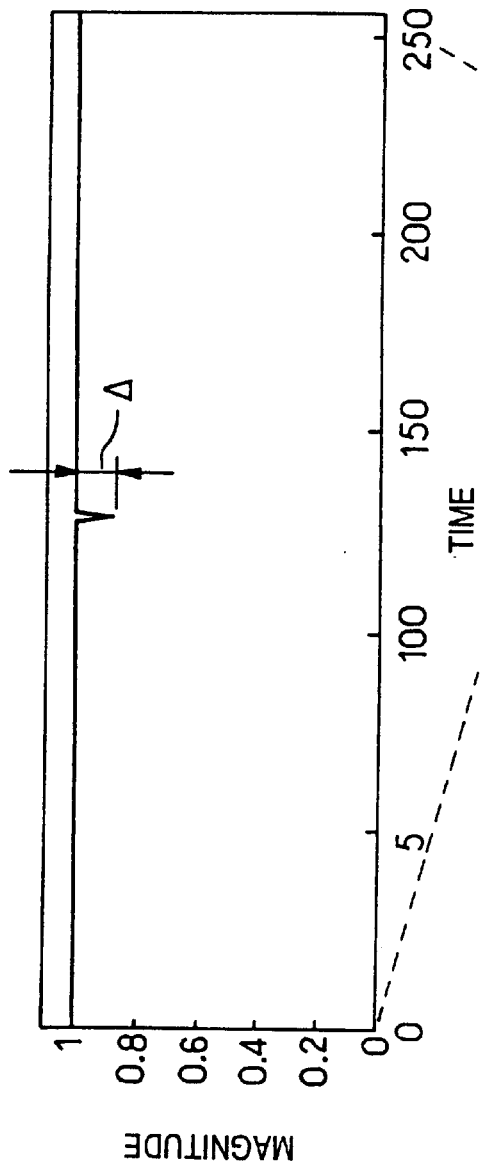
FIG. 3A is a diagram showing a single pulse signal.

Similarly, a single pulse signal $1-\Delta\delta(t-\tau)$ having an amplitude of the quantization step width $\Delta$ is inputted to the Wavelet transform unit 22, and only 512 samples are sampled. As shown in FIG. 3, $-20\log_{10}(\Delta/2)$, $-20\log_{10}(\Delta/4)$, ..., $-20\log_{10}(\Delta/256)$ which are proportional to the quantization step width of the ADC are observable in multiple resolutions corresponding to 8 scales.

A scale is the reciprocal of the frequency, and it changes from $2^8$ to $2^1$ in this example. On the other hand, it is seen that there exist $2^1$ to $2^8$ Wavelets along the time axis. The number of Wavelets which corresponds to the frequency, namely, "m" of $2^m$ is called a level. However, a scale which corresponds to the period, namely, "j" of $2^j$ is called a level by Martin Vetterli et al.

Figure 3B:
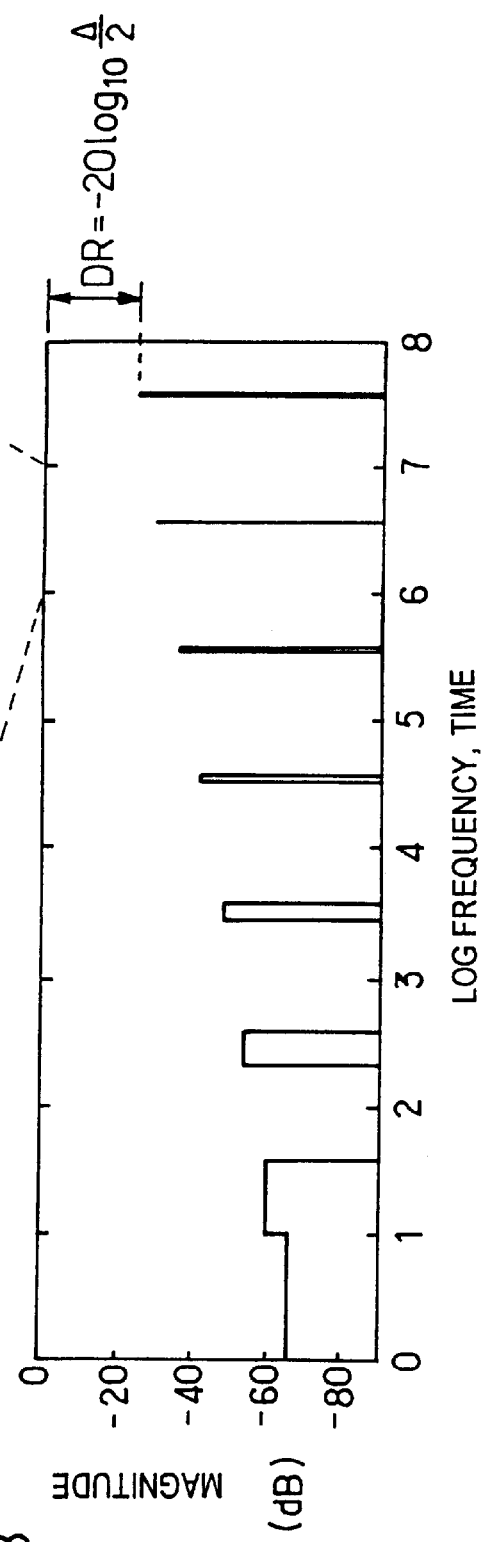
FIG. 3B is a diagram showing a result of a Wavelet transform (using Haar base) applied to the single pulse signal shown in FIG. 3A.

FIG. 3B shows a result of Wavelet transform which is observed at each scale level. Accordingly, it is possible to detect whether or not the quantization step size is working-properly by using the digital moving differentiator 22 or the Wavelet transform unit 22. On the other hand, if the single pulse signal is subject to the Fourier transform, the spectrum will be spread across the entire frequency band being observed, preventing a detection of whether or not the quantization step signal of the ADC is working properly. It will be noted that each logarithmic frequency zone shown in FIG. 3B, for example, (0,1), (1,2), ..., (6,7) and (7,8) allows the entire time range (0 to 250) to be observed in a compressed manner.

Assuming that a number of samples is equal to 512, the required volume of computation will be as follows.
 digital moving differentiator:
  1022 real number multiplications and 511 real number additions;
 Doubechies-Wavelet transform unit:
  4088 real number multiplications and 3066 real number additions.

The function and the effect of the interleaver 20 which is used in the present invention will now be described.

When the amplitude modulation signal z(n) given by the equation (7) and the amplitude A of the cosine wave being applied are inputted to the interleaver 20, the following signal f is derived:

$$f=(A, z(1), A, z(2), \ldots, A, z(n), \ldots)$$

The signal f is a train of sub-signals (A, z(n)) or comprises an impulse train having a height of A−z(n). It follows from the theory of the single pulse signal mentioned above that when the signal f is inputted to the digital moving differentiator or the Wavelet transform unit 22, the height of the impulse train can be estimated. A maximum value of the output from the digital moving differentiator or moving Wavelet transform unit 22 provides a dynamic range DR of the ADC under test.

$$DR \equiv -20\log_{10}\left[\frac{1}{\sqrt{2}} \cdot \frac{\Delta}{2}\right] \quad (9)$$

$$= -20\log_{10}\left[\frac{1}{2^{\hat{B}+0.5}}\right][dB]$$

Conversely, it is possible to estimate the instantaneous effective number of bits B of the ADC under test from the dynamic range DR observed.

$$B=\{DR/(20\log_{10} 2)\}-0.5[bit] \quad (10)$$

Figure 4:
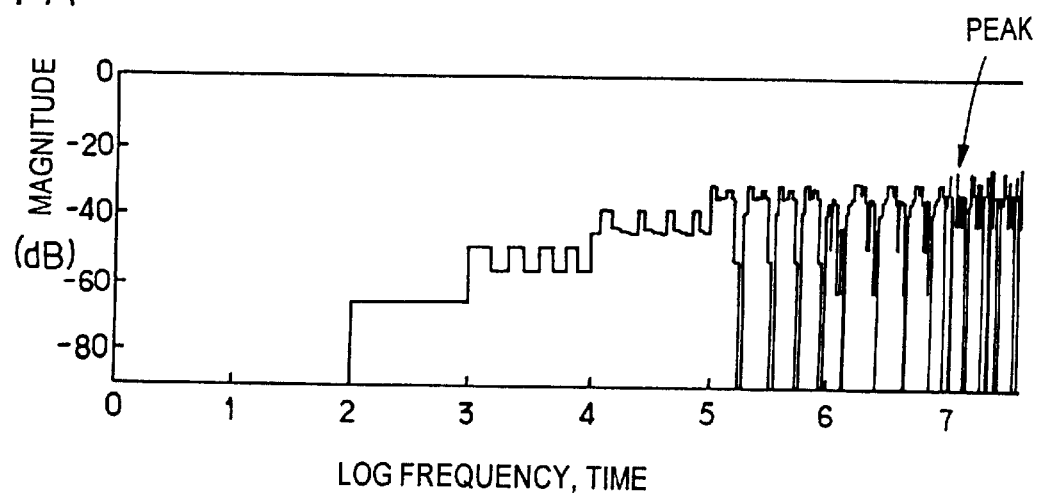
FIG. 4A is a diagram showing a result of the Wavelet transform (using Haar base) applied to an instantaneous amplitude which is estimated from an output from 4-bit ADC.
FIG. 4B graphically shows an estimation result of an instantaneous DNL obtained with the ADC evaluation system according to the present invention.
Figure 4:
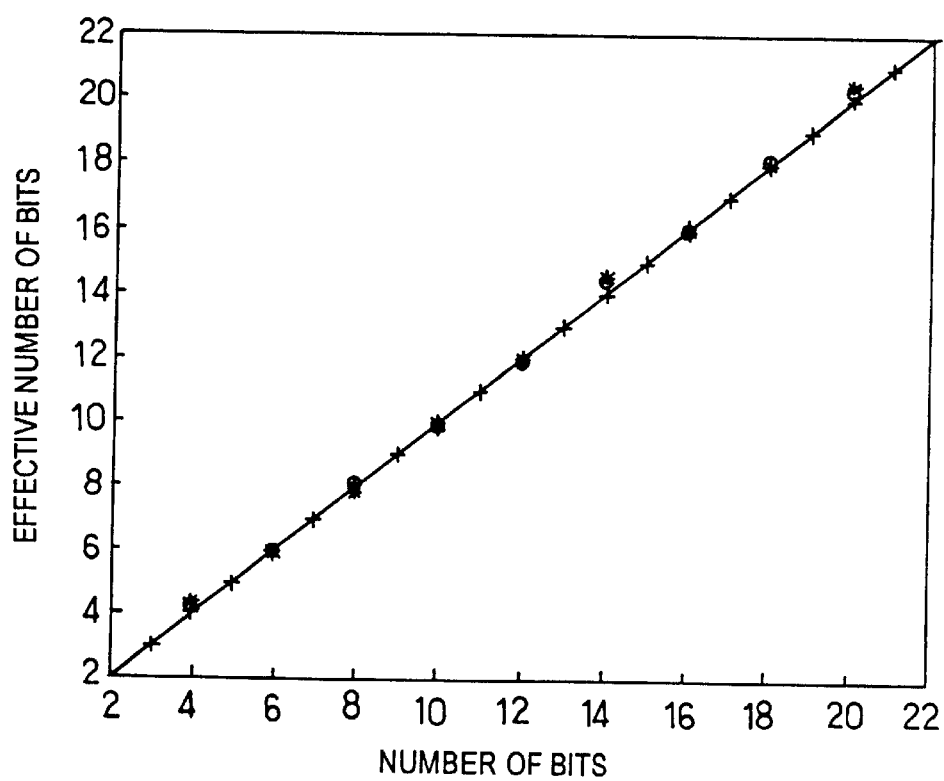

When the amplitude modulation signal given by the equation (7) is input to the digital moving differentiator or Wavelet transform unit 22 (FIG. 1), the instantaneous effective number of bits can be observed as a function of time as indicated in FIG. 4A. As a result of determining the absolute magnitude of the output from the digital moving differentiator or Wavelet transform unit 22 and supplying it to the peak (the maximum value) finder 23, the maximum value which is delivered from the peak finder 23 corresponds to the effective number of bits. It is also possible to estimate the instantaneous effective number of bits from this value using the equation (10). By changing the number of bits of the ADC under test from 2 to 22, this process of estimating the instantaneous effective number of bits has been verified. The result is indicated in FIG. 4B where "+" indicates the instantaneous effective number of bits which is estimated when the single pulse signal is inputted while "0" indicates the instantaneous effective number of bits which is estimated by inputting the sine wave to the ADC under test and using the combination of the instantaneous magnitude estimator, the digital moving differentiator or Haar-Wavelet transform unit, and the peak finder. In FIG. 4B, "*" indicates the instantaneous effective number of bits which is estimated by inputting the sine wave to the ADC under test and using the combination of instantaneous magnitude estimator, the Daubechies-Wavelet transform unit and-the peak finder. It will be seen that in each instance, the instantaneous effective number of bits which corresponds to the number of bits in the ADC under test is estimated.

In this manner, the combination of the instantaneous magnitude estimator 21 and the digital moving differentiator or Wavelet transform unit 22 which are used in accordance with the present invention provides a system which accomplishes the fourth and the fifth object mentioned above.

It will be understood from the foregoing description that the instantaneous magnitude estimator 21 which is used in the present invention functions (1) as an instantaneous effective number of bits estimator which is capable of independently dealing with factors in a compounded fault, (2) an effective number of bits estimator which permits an arbitrary choice of the testing frequency, and (3) an effective number of bits estimator which can be implemented in a simple hardware.

The combination of the instantaneous magnitude estimator 21 and the digital moving differentiator or Wavelet transform unit 22 which are used in the present invention functions as (4) an effective number of bits estimator which achieves a high accuracy of determination without increasing the length of time, and (5) a system which allows the instantaneous effective number of bits to be observed as a function of time.

Next, several preferred embodiments of the present invention will be described in detail with reference to the drawings.

Figure 5:
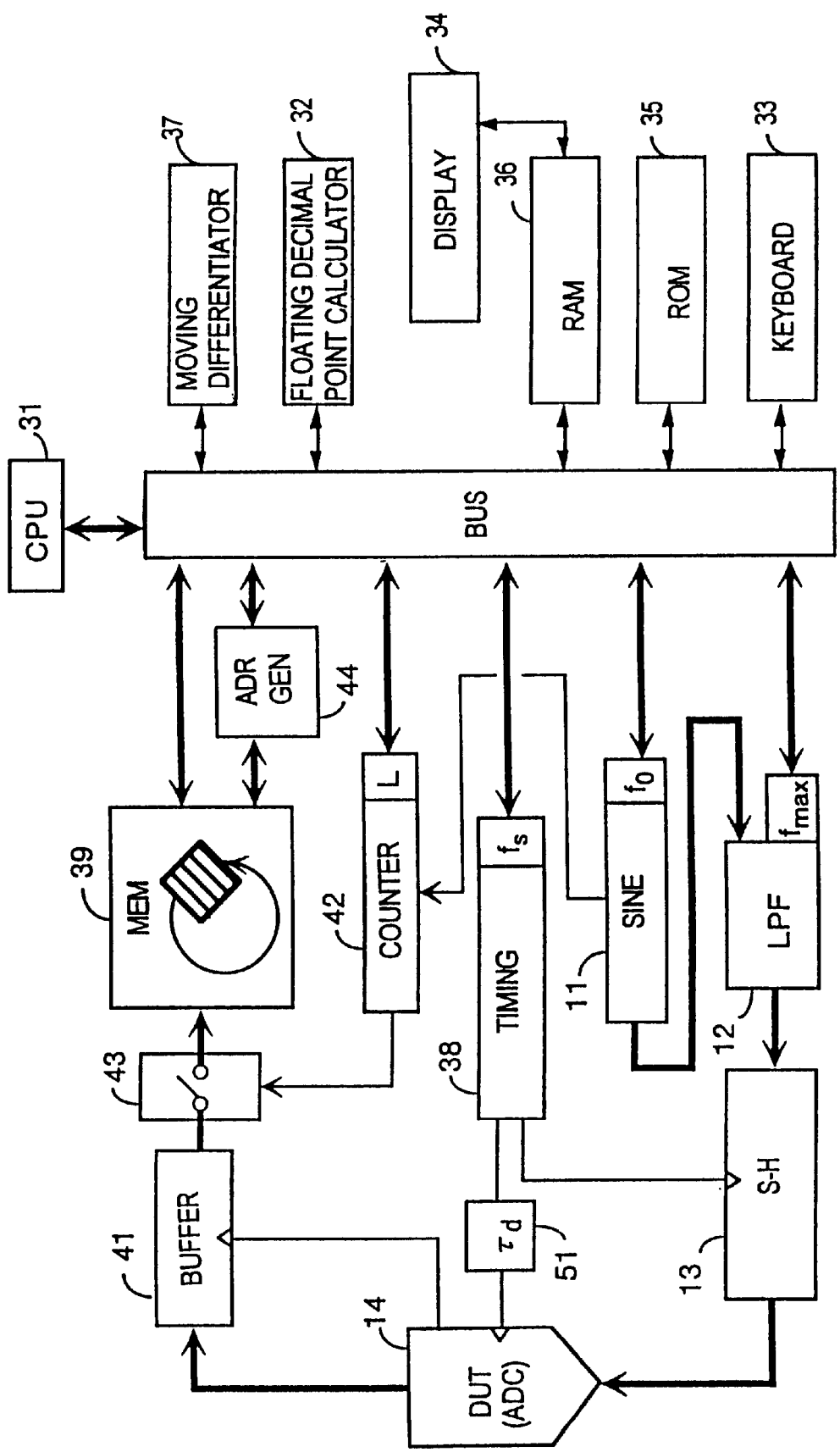
FIG. 5 is a block diagram of an essential part of a first embodiment of the ADC evaluation system according to the present invention.

FIG. 5 shows the arrangement of an effective number of bits estimator according to the present invention. The arrangement comprises a CPU 31 which performs a data entry and delivery as well as a calculation, a floating decimal point calculator chip 32, a keyboard or a front panel 33 which is used for entry of parameters or instructions, a display 34 which displays a menu selected by a user or a result of determination, and ROM 35, RAM 36 or disk unit which store user input or other data. In addition, the arrangement houses a digital moving differentiator 37. A signal generator 11 for generating an analog signal delivers a sine wave, which is applied to an ADC 14 under test. A timing controller 38 produces a clock, which is applied to the ADC 14 to control the timing of the A/D conversion which takes place within ADC 14. A waveform memory (RAM Signal) 39 reads a digital signal which is stored in a buffer 41 connected to the output of the ADC 14 in synchronism with the end of conversion signal from the ADC 14, for example. The waveform memory 39 may be of a size of 1024, for example (having a memory address of 0–1023). The analog signal generator 11 also generates a trigger signal, which starts a remaining sample counter 42. When the count in the counter 42 is equal to zero, for example, a switch 43 which couples the buffer 41 to the waveform memory 39 is turned off, thus terminating the writing of the digital signal into the waveform memory 39. Assuming that the last write address to the waveform memory 39 is 500 (or 1023), this last write address is read out from an address generator and is incremented by one by the remainder operation, thus providing an address of 501 (or 0) where the oldest sample is stored. Thus, when the last write address to the waveform memory 39 is read out from the address generator 44 and incremented by one, individual samples can be read out in sequential order beginning with the oldest sample.

The frequency $f_0$ and the amplitude A of the sine wave, the sampling frequency $f_S$, the highest frequency $f_m$ and the pass band of a low pass filter 12, and a number of remaining samples L which is predetermined as a trigger condition can be selected by a user and entered through the keyboard 33 or the front panel. These parameters may be previously written into a file saved in a disc and read from the file upon commencement of the test. CPU 31 writes these parameters into control registers associated with the signal generator 11, the low pass filter 12 and the waveform memory 39.

Figure 6:
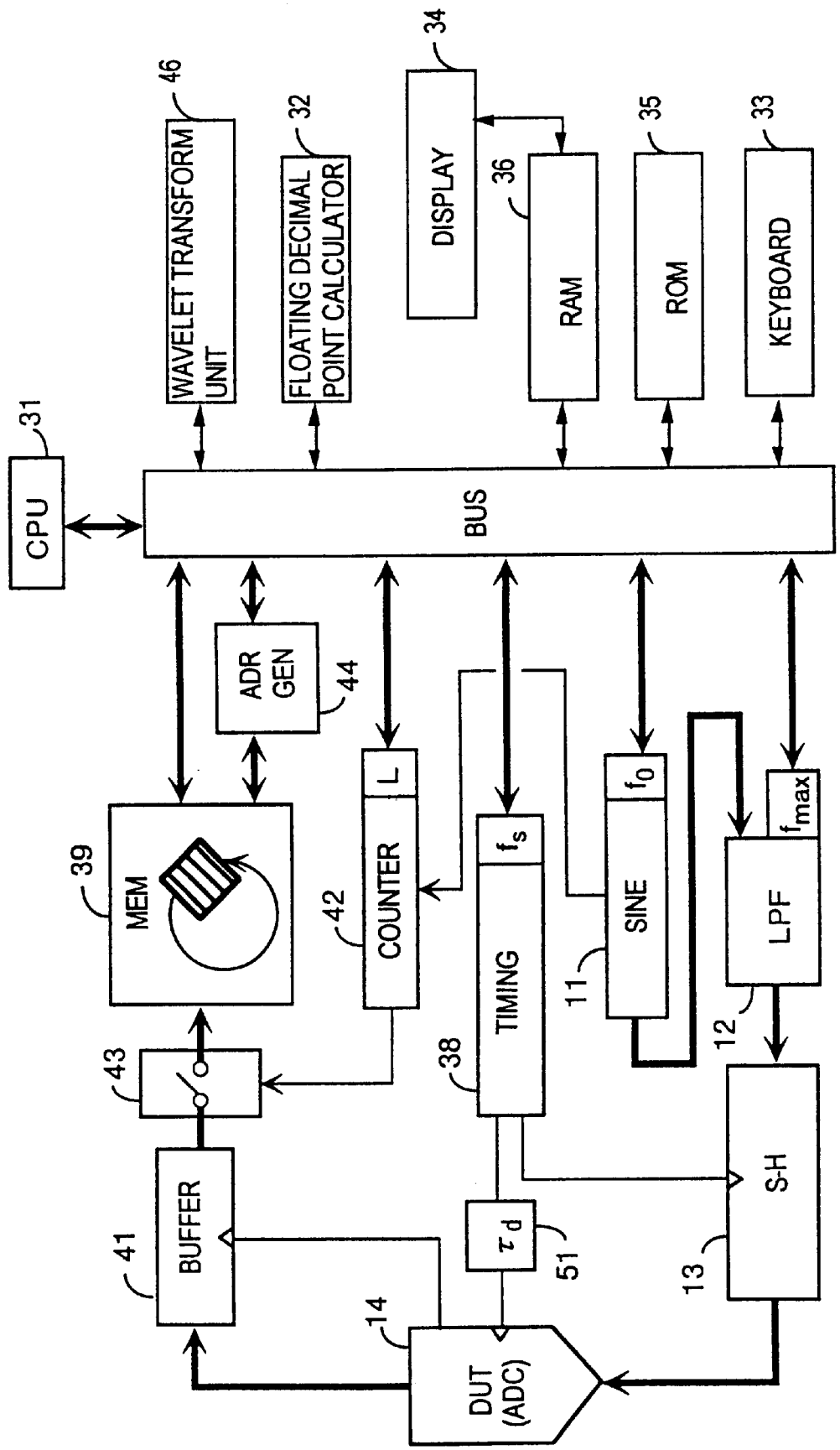
FIG. 6 is a block diagram showing an essential part of a second embodiment of the ADC evaluation system according to the present invention.

FIG. 6 shows the overall arrangement of another form of effective number of bits estimator according to the present invention, and corresponding parts to those shown in FIG. 5 are designated by like reference characters as used in FIG. 5. The arrangement shown in FIG. 6 differs from the arrangement shown in FIG. 5 in that the digital moving differentiator 37 shown in FIG. 5 is replaced by a Wavelet transform unit 46.

Figure 7:
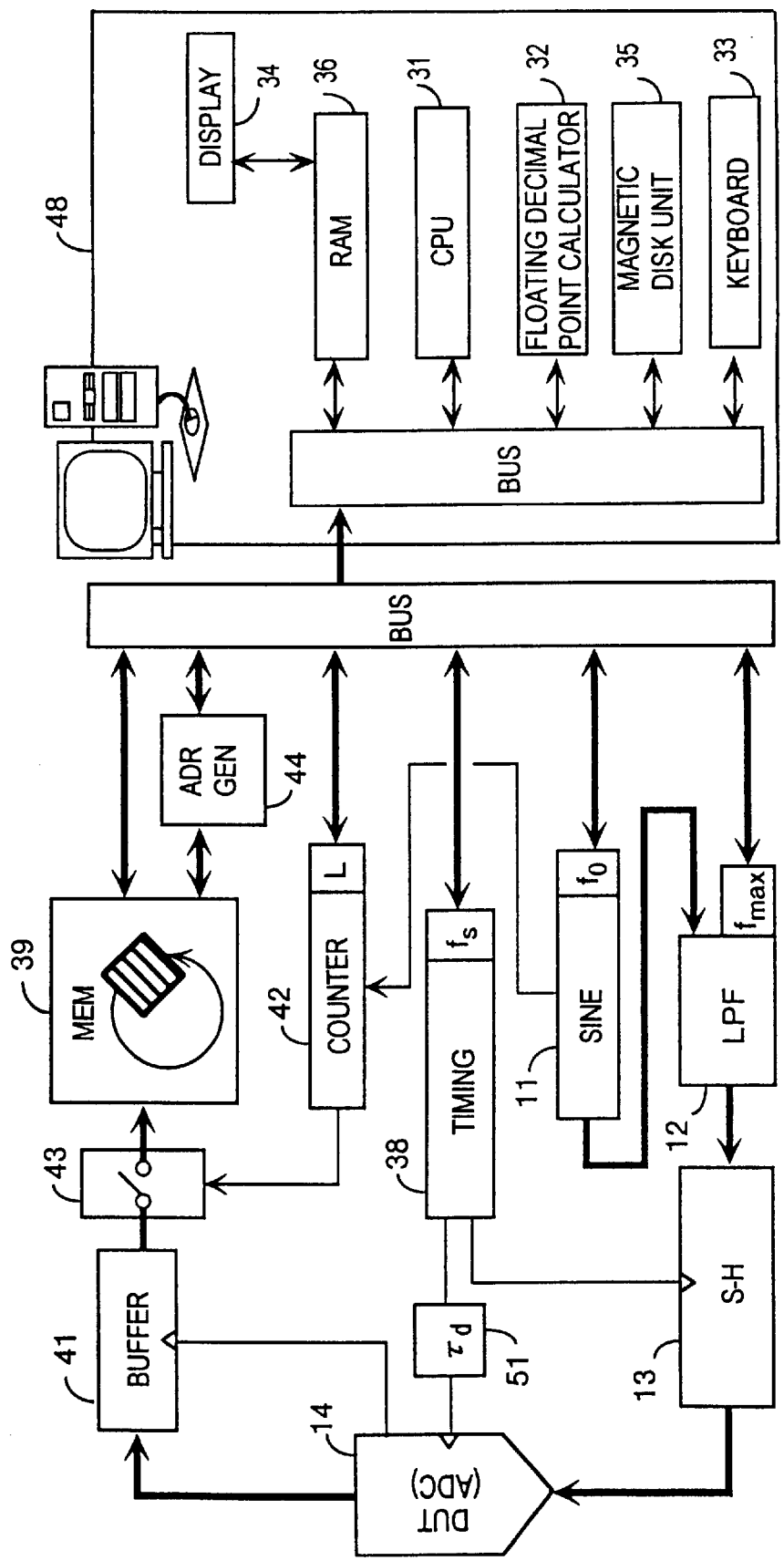
FIG. 7 is a block diagram showing an essential part of a third embodiment of the ADC evaluation system according to the present invention.

FIG. 7 shows the arrangement of a further form of an effective number of bits estimator according to the present invention and is distinct from the arrangements shown in FIGS. 5 and 6 in that a control computer 48 exercises a control over the effective number of bits estimator. The computer may comprise SPARC computer available from Sun Microsystems. This computer has the functions of CPU 31, the floating decimal point calculator chip 32, the keyboard 33, the display 34, ROM 35, RAM 36, the interleaver, the digital moving differentiator 37 and the Wavelet transform unit 46.

Embodiment 1

Figure 8A:
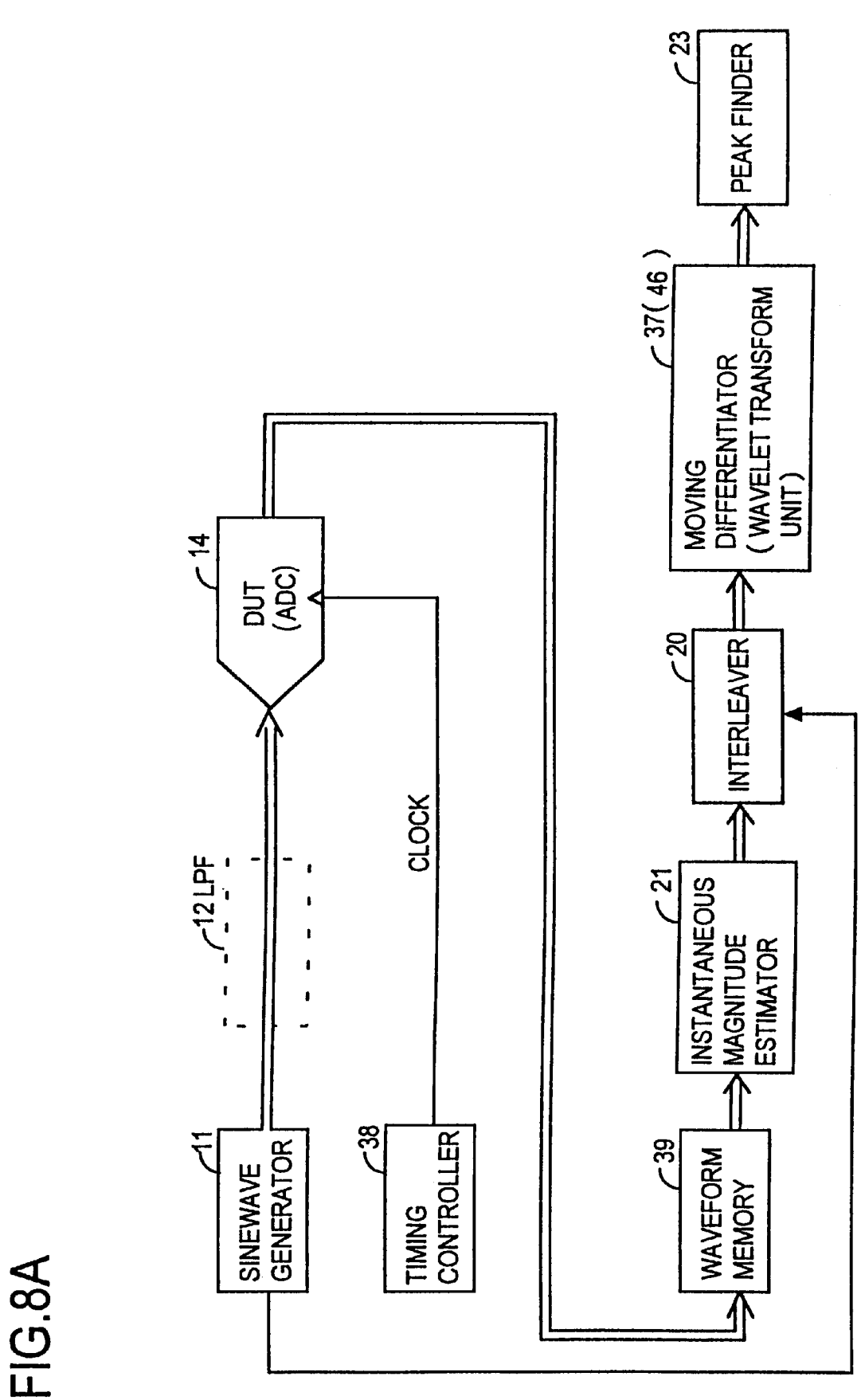
FIG. 8A is a block diagram of the overall arrangement of one form of the ADC evaluation system according to the present invention.

FIG. 8A shows a schematic view of an effective number of bits estimator according to the present invention, which functions to estimate an effective number of bits of an ADC 14 which internally contains a sample-and-hold circuit. A signal generator 11 which generates an analog signal provides a sine wave, which is applied to the ADC 14 under test. A timing controller 38 produces a clock which is applied to the ADC 14 for controlling the timing of the A/D conversion operation thereof. A waveform memory 39 accumulates a digital signal from the ADC 14 in synchronism with an end of conversion signal from the ADC 14, for example. An instantaneous magnitude estimator forms a pair of suitable data $\hat{X}[n]$ and $\hat{X}[m]$ in an array of digital waveform taken therein and determines a sum of squares thereof in accordance with the equation (7) and also forms a square root of the sum of the squares to calculate an instantaneous amplitude z(n).

An interleaver 20 receives a train of such instantaneous amplitudes as an input, and produces an interleaved signal from the amplitude A of the sine wave and the train of instantaneous amplitudes. The interleaved signal is supplied to a digital moving differentiator 37 as an input, which then operates to calculate a moving difference, thus sequentially delivering a difference between a current input value and an immediately preceding input value. Since the input interleaved signal is formed in the sequence of ( . . . A, z(n), A, . . . ), it will be seen that a difference having the same absolute value |A−z(n)| is delivered two times in succession. Accordingly, the digital moving differentiator 37 is arranged to deliver only one sample every two samples, thus delivering the absolute magnitude |A−z(n)| only once. To summarize, the instantaneous amplitude comprising M samples is input to the interleaver 20, the output of which is processed by the digital moving differentiator 37, thus delivering a number of samples which are equal to M as an output. The array of difference signals is input to a peak finder 23 in order to detect and deliver a maximum amplitude. When a logarithm of the detected maximum amplitude is formed and is substituted into the equation (10) as a dB value, an instantaneous effective number of bits B can be estimated.

As indicated in parentheses in FIG. 8A, the moving differentiator 37 may be replaced by a Wavelet transform unit 46.

Embodiment 2

Figure 8B:
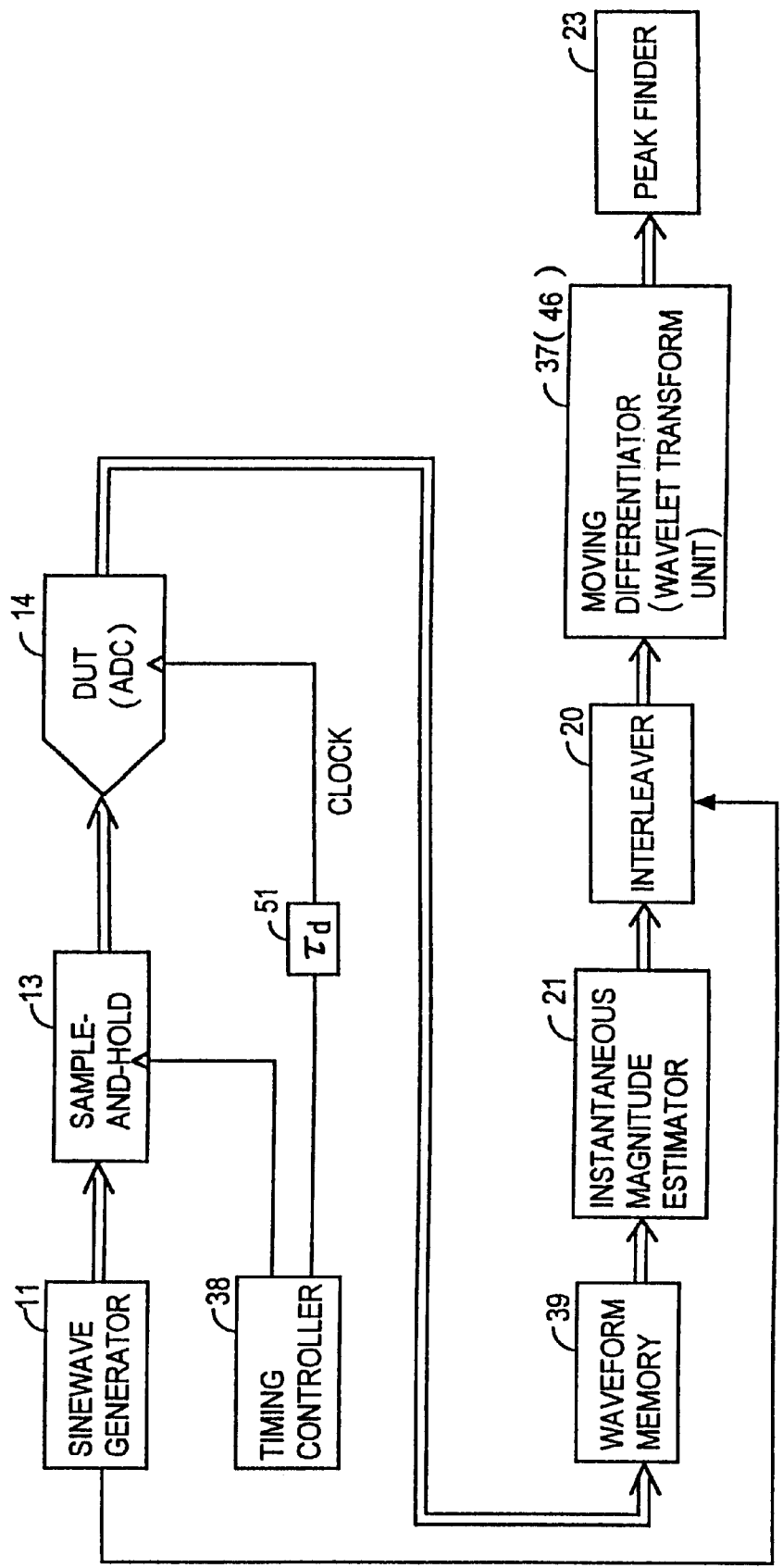
FIG. 8B is a block diagram showing the arrangement of another form of ADC evaluation system according to the present invention.

FIG. 8B shows another embodiment which estimates an effective number of bits of an ADC which does not internally contains a sample-and-hold circuit. A sine wave from an analog signal generator 11 is retained in a sample-and-hold circuit 13 during a clock duration provided by a clock generator 38 before it is applied to an ADC 14 under test. A waveform memory RAM 39 accumulates a digital signal from the ADC 17. A conversion operation by the ADC 14 is delayed by one clock by means of a delay element 51 so that the operation takes place in a stabilized condition of a sample held in the sample-and-hold circuit 13. In other respects, the arrangement is similar to that shown in FIG. 8A, and accordingly, the moving differentiator 37 may be replaced by Wavelet transform unit 46.

Embodiment 3

As indicated in broken lines, a low pass filter 12 may be provided in the arrangement of FIG. 8A to eliminate distortion components from the sine wave generated from the signal generator 11 before it is applied to the ADC 14 which internally houses a sample-and-hold circuit. Also in FIG. 8B, a similar low pass filter 12 may be provided on the outside of the signal generator 11 in order to eliminate distortion components.

Embodiment 4

Figure 9:
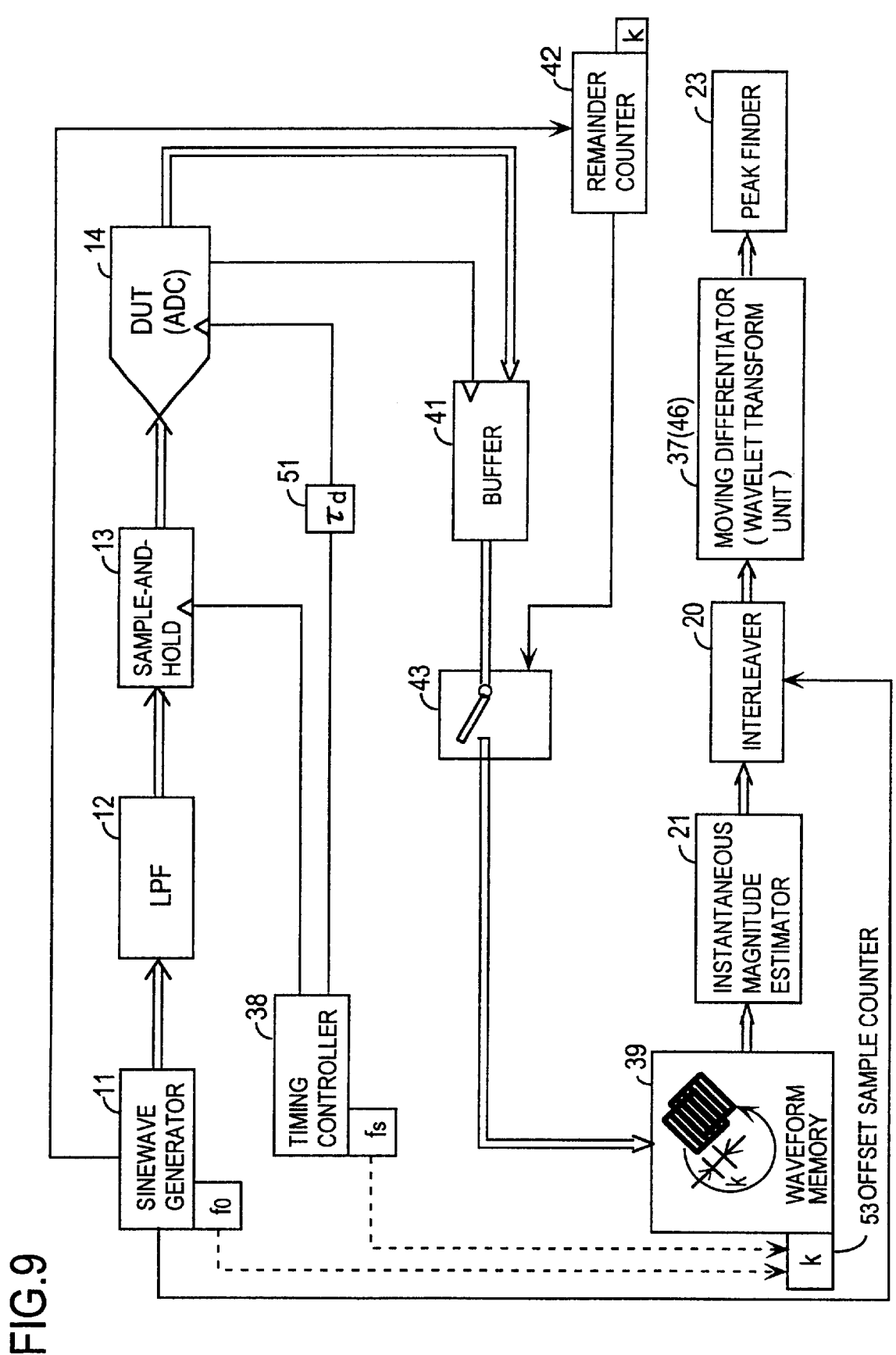
FIG. 9 is a block diagram showing a memory and parts located therearound which are used in the ADC evaluation system shown in FIG. 8 in detail.

FIG. 9 shows parts disposed around the waveform memory in the system of the present invention. A sine wave from an analog signal generator 11 is applied to an ADC 14 under test. A waveform memory 39 accumulates a digital signal from the ADC 14.

A. Signal Capture Through Trigger

The analog signal generator 11 also generates a trigger signal, which starts a remaining sample counter 42 which is preset to a number of remaining samples L. Each time a new sample is received, the count in the counter 42 is decremented by one. When the count in the counter 42 becomes equal to zero, a switch 43 which is coupled to the waveform memory 39 is turned off to terminate the write-in of the digital signal to the waveform memory 39.

B. Signal Capture Through Internal Timing

The CPU 38 shown in FIG. 5 or 6, or the control computer 48 shown in FIG. 7 operates to execute a command selected by a user or a command from a file which is read out from the disc together with the sub-system. When a command "hold an input signal" is given, the CPU or the control computer turns the switch 43 which is coupled to the waveform memory 39 off, thus terminating the write of the digital signal into the waveform memory 49.

In either instance, a read-out of the digital waveform from the waveform memory 39 takes place as follows:

It is initially assumed that the waveform memory 39 has a size of 1024, meaning that memory addresses are from 0 to 1023. If a last write address to the waveform memory 39 were 500 (or 1023), the last write address may be read out from the address generator 44 and incremented by one by the remainder operation to provide an address of 501 (or 0). The oldest sample is stored at this address. Thus, samples can be sequentially read out beginning with the oldest sample by reading out the last write address into the waveform memory 39 from the address generator 44 and incrementing it by one by the remainder operation.

A device 53 for calculating "a number of offset samples between waveform memories which store digital waveforms having a phase difference of 90° therebetween" which correspond to the cosine wave and the sine wave is given the frequency fo of the sine wave and the sampling frequency $f_S$ of the ADC 14 to calculate "a number of offset samples k within the waveform memory 39 which store the digital waveforms having a phase difference of 90°".

$$k=[f_S/(4f_o)] \qquad (11)$$

where [y] represents a maximum integer equal to or less than y. An instantaneous magnitude estimator 21 takes digital waveforms for (M+k) samples from the waveform memory 39 where M represents "a number of samples selected for estimation of the effective number of bits" and k "a number of offset samples" which is determined by the number of offset samples calculator 53. Subsequently, the instantaneous magnitude estimator 21 forms pairs of $\hat{X}[0]$ and $\hat{X}[k]$, $\hat{X}[1]$ and $\hat{X}[k+1]$, . . . , $\hat{X}[M]$ and $\hat{X}[M+1]$, respectively, in the array of digital waveforms which has been taken therein by incrementing by one by the remainder operation, forms a sum of squares thereof and forms a square root of the sum of squares to calculate the instantaneous amplitude z(n) in accordance with the equation (7).

The array of instantaneous amplitudes is supplied to an interleaver 20 as an input, which then produces interleaved signals using the amplitude A of the sine wave and the array of instantaneous amplitudes.

The interleaved signals produced by the interleave 20 are input to a digital moving differentiator 37, which then calculates the moving differences between the interleaved signals. A peak finder 23 receives the array of the difference signals as inputs, and detects and delivers a maximum amplitude. A logarithm of the detected maximum amplitude is formed and is substituted to the equation (10) to estimate the instantaneous effective number of bits B.

Alternatively, the instantaneous amplitudes z(n) which are determined by the instantaneous amplitude estimator 21 may be fed in the time sequence to the digital sequence differentiator 37 where a moving difference with respect to an immediately preceding instantaneous amplitude z(n−1) may be calculated. The peak finder 23 receives the moving differences as inputs, compares the maximum value which has been stored therein up to this point in time against the new moving difference, and chooses a greater one of them to be stored and delivered as a maximum amplitude. A logarithm of the detected maximum amplitude may be formed to estimate the instantaneous effective number of bits B according to the equation (10). Again, as indicated in parentheses, the moving differentiator 37 may be replaced by Wavelet transform unit 46. In this instance, M represents a number of Wavelet transformed samples.

Embodiment 5

Figure 10:
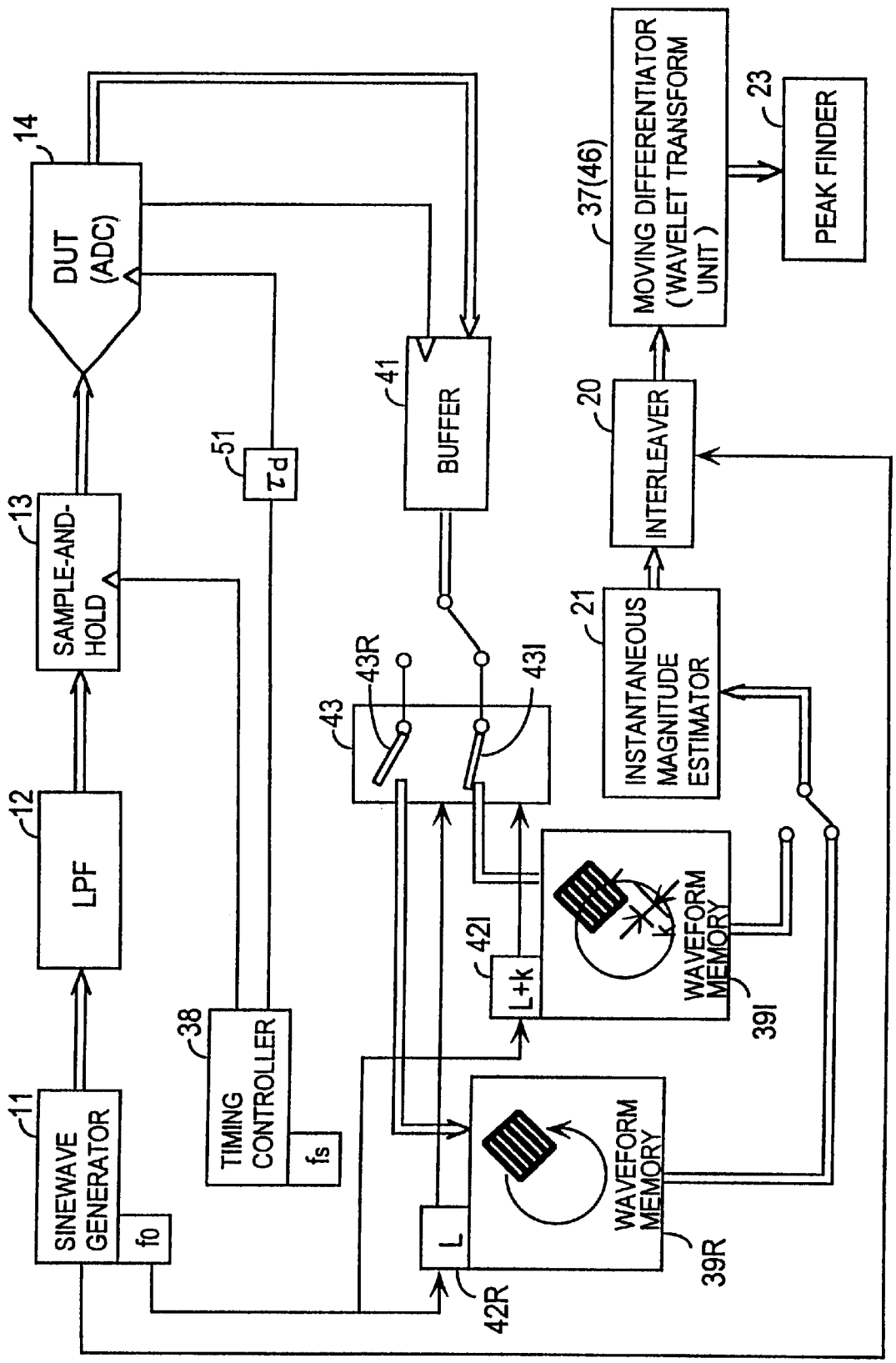
FIG. 10 is a block diagram showing another form of memory and parts located therearound which are used in the ADC evaluation system shown in FIG. 8 in detail.

FIG. 10 shows parts disposed around the waveform memory 39 in the system of the present invention. It is assumed that a real part waveform memory 39R has a remaining sample counter 42R associated therewith in which a number of remaining samples L is preset. A device for calculating "a number of offset samples in a digital waveform having a phase difference of 90° therebetween" which correspond to the cosine wave and the sine wave is supplied with the frequency $f_0$ of the sine wave and the sampling frequency $f_S$ of the sampling frequency of the ADC to calculate "a number of offset samples k in the digital waveform having a phase difference of 90°" according to the equation (11). An imaginary part waveform memory 39I has a remaining sample counter 42I associated therewith which is preset to L+k. It is assumed that a selection switch 43 associated with the waveform memory 39 now selects the real part waveform memory 39R. A signal generator 11 which generates an analog signal generates a cosine wave, which is applied to an ADC 14 under test. The real part waveform memory 39R accumulates a digital signal from the ADC 14. A trigger signal generated by the analog signal generator 11 starts the remaining sample counters 42R, 42I, and when the count in the remaining sample counter 42R becomes equal to zero for example, a switch 43R coupled to the real part waveform memory 39R is turned off, terminating the write-in of the digital signal into the real part digital memory 39R, followed by a selection of the imaginary part waveform memory 39I by a selection switch 43I associated therewith. The signal generator 11 which generates an analog signal generates a cosine wave, which is then applied to the ADC 14 under test. The imaginary part waveform memory 39I accumulates a digital signal from the ADC 14. As before, a trigger signal generated by the analog signal generator 11 starts the remaining sample counter 42I, and when the count in the remaining sample counter 42I becomes equal to zero, for example, the switch 43I coupled to the imaginary part waveform memory 39I is turned off, terminating the writing of the digital signal into the imaginary part waveform memory 39I. Sine waves corresponding to the imaginary part are stored in the waveform memory 39I for the number of offset samples k.

The instantaneous magnitude estimator 21 takes digital waveforms for M samples from the real part waveform memory 39R and the imaginary part waveform memory 39I where M represents "a number of samples selected to estimate the effective number of bits". Then, taking pairs of $\hat{X}.re[0]$ and $\hat{X}.im[0]$, $\hat{X}.re[1]$ and $\hat{X}.im[1]$, ..., $\hat{X}.re[M]$ and $\hat{X}.im[M]$ in the array of digital waveforms, each of which has been taken therein by incrementing by one by the remainder operation, the instantaneous magnitude estimator 21 determine a sum of squares thereof and then calculates a square root of the sum of squares to determine an array of instantaneous amplitudes.

$$z(n) = \sqrt{\hat{X}.re[n]^2 + \hat{X}.im[n]^2} \qquad (12)$$

The array of instantaneous amplitudes is supplied to the interleaver 20 as inputs, which then produces interleaved signals using the amplitude A of the sine wave and the array of instantaneous amplitudes.

The digital moving differentiator 37 and the maximum value finder 23 operate in a similar manner as mentioned above. As indicated in parentheses in FIG. 10, the moving differentiator 38 may be replaced by Wavelet transform unit 46. In this instance, M represents a number of Wavelet transformed samples.

Figure 11:
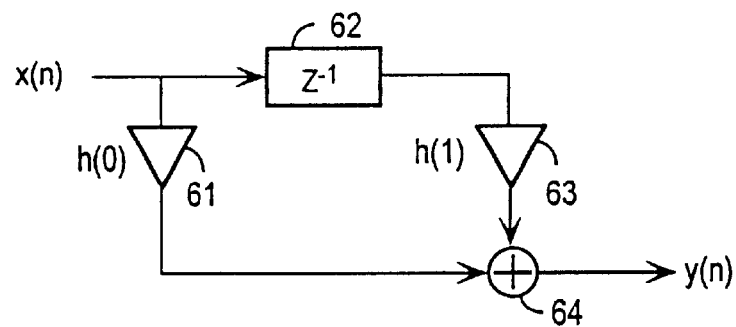
FIG. 11 is a circuit diagram showing one specific example of a digital moving differentiator used in the present invention.

FIG. 11 shows a specific example of the digital moving differentiator 37, which is non-cyclic filter represented by the following equation:

$$y(n) = h(N)x(n-N) + h(N-1)x(n-N+1) + \ldots + h(1)x(n-1) + h(0)x(n) \qquad (13-1)$$

where it may be assumed that $h(0)=\frac{1}{2}$, $h(1)=-\frac{1}{2}$ and other filter coefficients are $h(2)=\ldots=h(N)=0$, whereupon the filter represents a difference filter represented as follows:

$$y(n) = -(\tfrac{1}{2})x(n-1) + (\tfrac{1}{2})x(n) \qquad (13-2)$$

Thus, x(n) is supplied to a multiplier 61 and a one sample period delay element 62 and an output from the delay element 62 is supplied to a multiplier 63. The multipliers 61 and 63 multiply respective input by a factor of $h(0)=\frac{1}{2}$ and $h(1)=-\frac{1}{2}$, respectively, and their multiplication results are added together in an adder 64 to provide an output y(n). In this manner, an output signal represents a difference between the current value x(n) and an immediately preceding value x(n−1) of the input signal. A procedure to determine optimum filter coefficients is described in "Discrete-Time Signal Processing", by Alan V. Oppenheim, Ronald W. Schafer, Prentice-Hall, 1989, in particular, 7.5.2 Discrete-Time Differentiators. The difference filter may be implemented in either a digital filter shown in FIG. 16 or a digital moving differentiator which is used to perform a calculation of the equation (13-2).

A method of observing a time distribution of local maxima in the instantaneous effective number of bits will now be considered. When M samples are input to a digital moving differentiator, (M−1) differences are delivered as outputs. Accordingly, the period of the difference output corresponds to the period of the input. By using the frequency $f_0$ of the sine wave and the sampling frequency $f_S$ of the ADC as inputs, "a number of samples p per period" is calculated.

$$p = [f_S/f_0] \qquad (14)$$

The "number of samples p per period" is used as a control input to a peak finder. When p difference samples each having an absolute value are supplied, a processing operation takes place which comprises (a) forming a logarithm of the absolute value of only a maximal value and using it to deliver an instantaneous effective number of bits B according to the equation (10), and (b) delivering zeros for the remaining (p−1) data. By this processing operation, it is possible to observe an instantaneous effective number of bits at a maximal value as a function of time.

Figure 12:
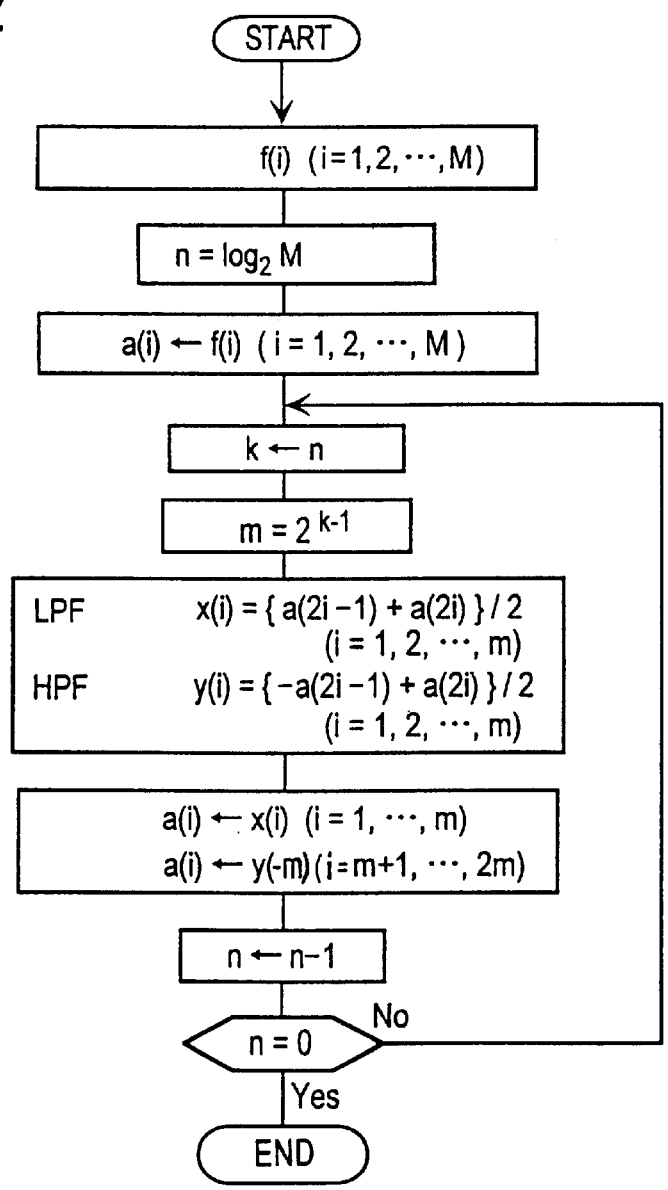
FIG. 12 is a flow chart illustrating the operation of the Haar Wavelet transform unit.

FIG. 12 shows a flow of processing which takes place in the Wavelet transform unit 46 where Haar base function is used. In addition, a normalization factor of ½ is used here, but may be $1/\sqrt{2}$ as is commonly used. M input signals f(i), (i=1, 2, . . . , M) are used to calculate $n=\log_2 M$, thus converting input signals f(i) to output signals a(i). k is changed to be n, n−1, . . . , 2, 1, and for $m=2^{k-1}$, a low pass filtering takes place by the calculation of x(i)={a(2i−1)+a(2i)}/2 (i=1, 2, . . . , m) and a high pass filtering is applied by the calculation of y(i)={−a(2i−1)+a(2i)}/2 (i=1, 2, . . . , m). As a result of these calculations, a(i)=x(i), (i=1, 2, . . . , m) and a(i)=y(i), (i=m+1, . . . , 2m) are outputted.

Figure 13:
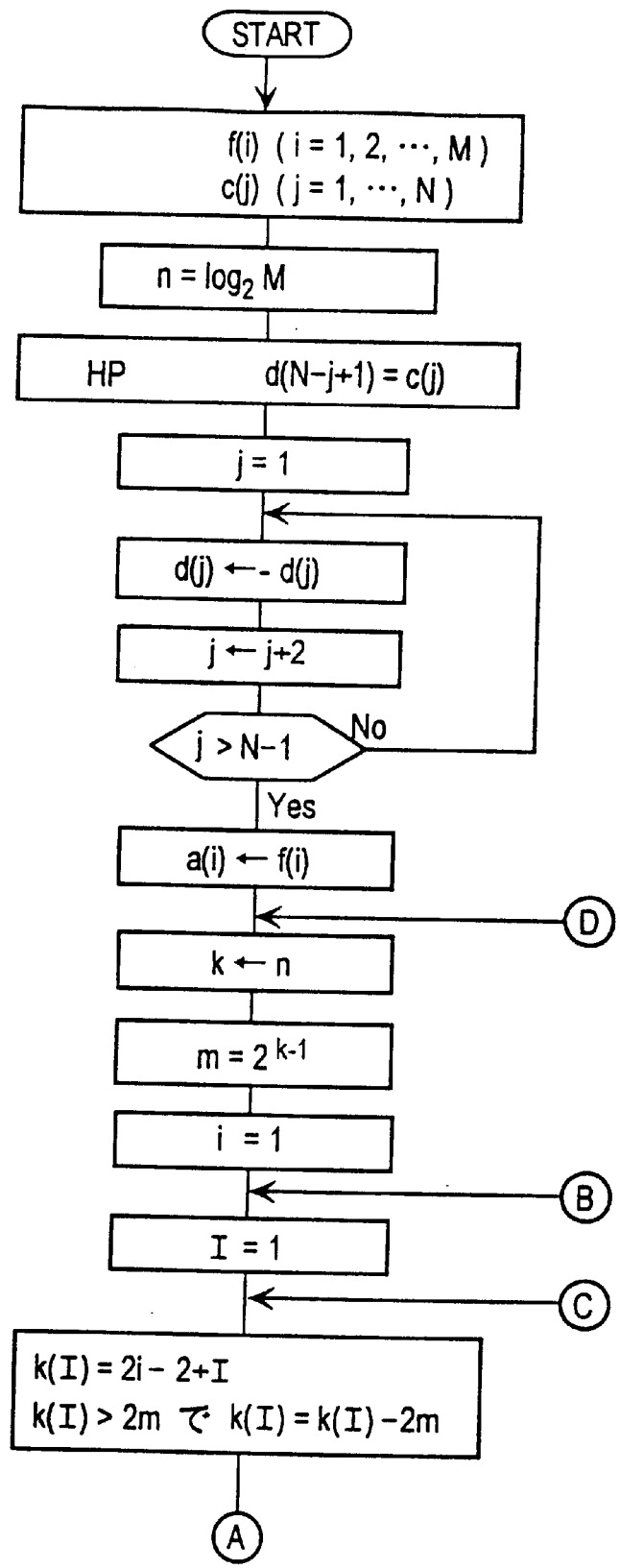
FIG. 13 is a flow chart showing a part of the operation of Daubechies Wavelet transform unit.
Figure 14:
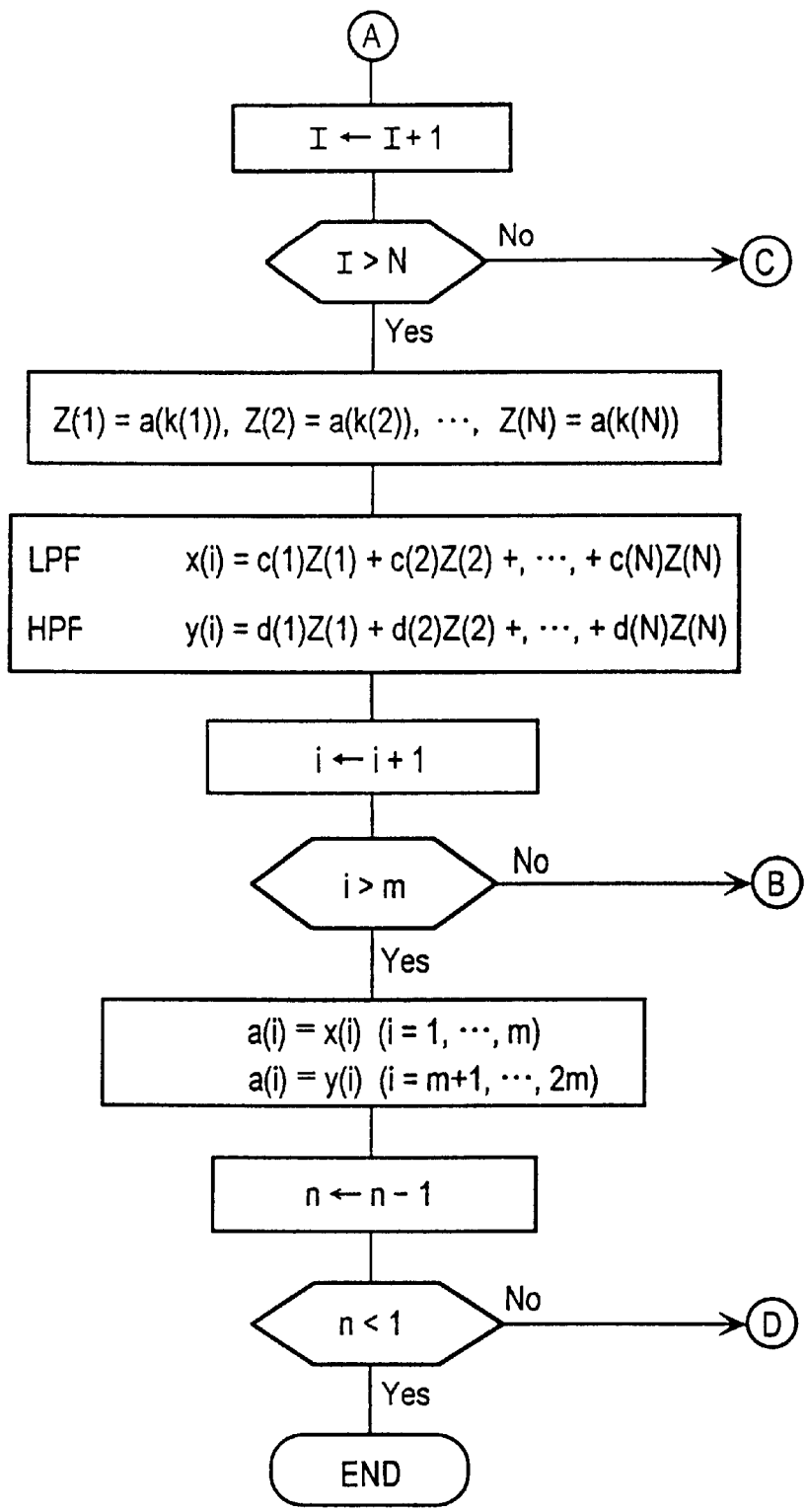
FIG. 14 is a flow chart showing the operation which takes place as a continuance from the flow chart shown in FIG. 13.

FIGS. 13 and 14 show a flow of processing in the Wavelet transform unit when using Daubechies base function. In these flow charts, a scale corresponding to a period or "k" in $2^{k-1}$ is treated as "level k". The algorithm of the Wavelet transform is described in detail in "Wavelets and Subband Coding", by Mathin Vetterli, Jelena Kovacevic, Prentice-Hall, 1995. The implementation of the Wavelet transform in VLSI is reported in "VLSI Implementation of Discrete Wavelet Transform", by Aleksander Grezeszczak, Mrinal K. Mandal, Sethuraman Panchanathan, Tet Yeap, IEEE Trans. Very Large Scale Integration (VLSI) System, Vol. 4, No. 4, 1996. Accordingly, the Wavelet transform unit may comprise the Wavelet transform unit as shown in FIG. 12 or 13 or VLSI implemented Wavelet transform unit.

Figure 15:
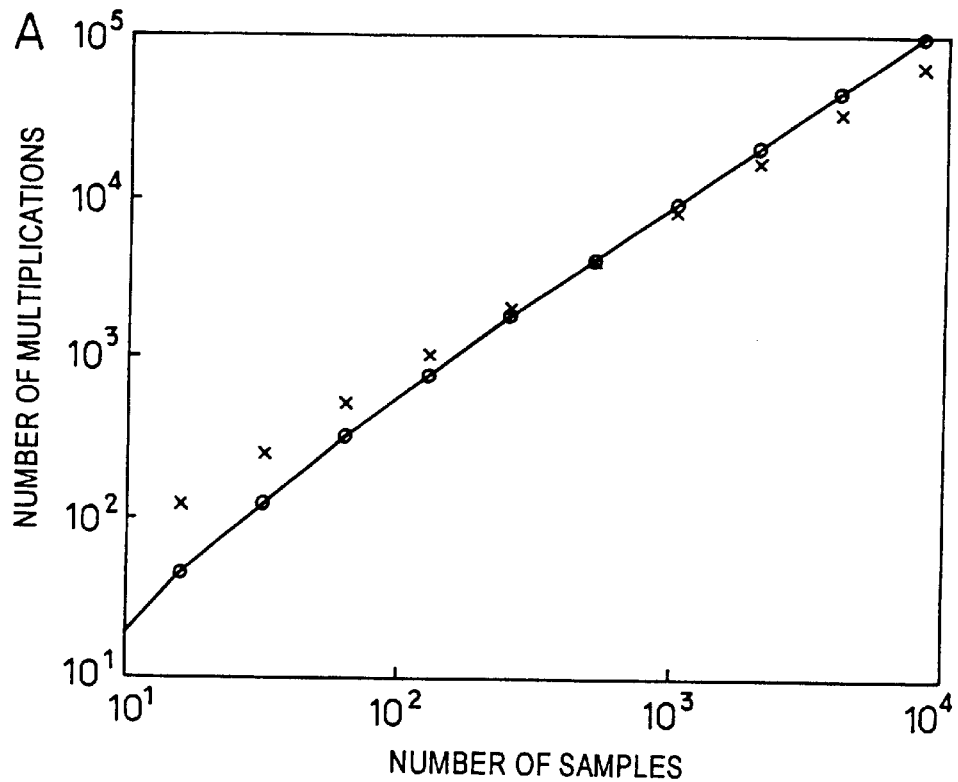
FIGS. 15A–B graphically shows a comparison of real number multiplications (between fast Fourier transform and Daubechies Wavelet transform)
Figure 15:
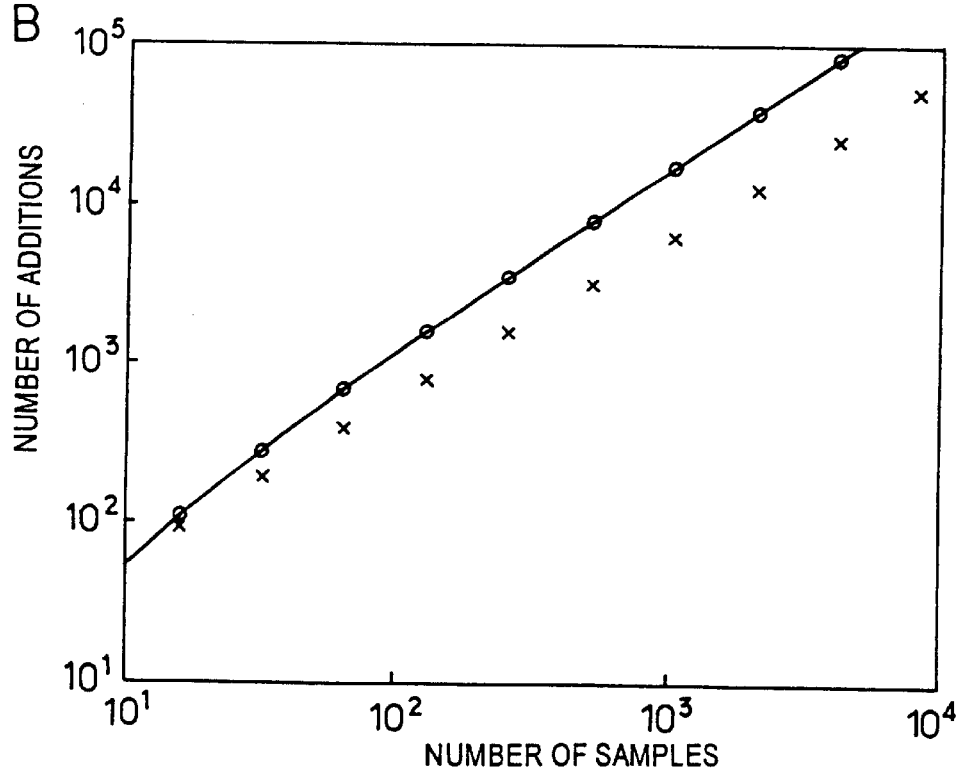

FIG. 15A compares a number of real number multiplications between the Daubechies-Wavelet transform and the fast Fourier transform. A single Daubechies-Wavelet transform includes a volume of computation which is substantially equivalent to that of two Haar-Wavelet transforms. For 512 samples, the number of real number multiplications is substantially similar for both Daubechies-Wavelet transform and the fast Fourier transform. At or above 1024 samples, the number of real number multiplications for the Daubechies-Wavelet transform becomes less than the number of real number multiplications for the fast Fourier transform.

A method of observing a time distribution of a maximal value in the instantaneous effective number of bits will now be described. When M samples are inputted to the Wavelet transform unit, M/2 ($M/2^{i+1}$) results of Wavelet transform are delivered for the maximum (general) scale level $K_{MAX}$ ($K_{MAX}^{-i}$). Accordingly, the period of the result of the Wavelet transform corresponds to $\frac{1}{2}(1+2^{i+1})$ times the period of the input. Using the frequency $f_0$ of the sine wave and the sampling frequency $f_S$ of the ADC, "a number of samples $p_i$ per period for the scale level ($K_{MAX}^{-i}$)" is calculated.

$$p_i = \frac{1}{2}^{i+1}[f_S/f_0] \qquad (15)$$

Figure 16:
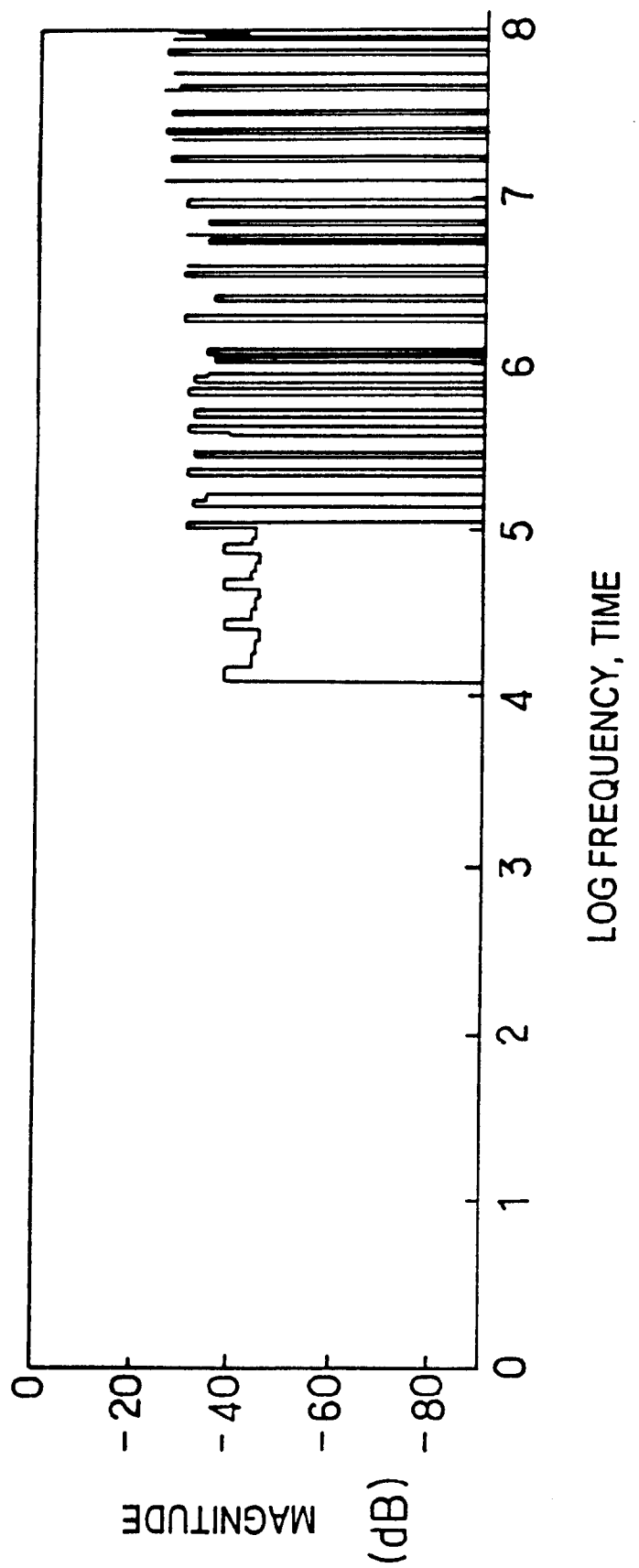
FIG. 16 is a diagram showing an example of local maxima of the instantaneous DNL as a function of time.
Figure 17A:
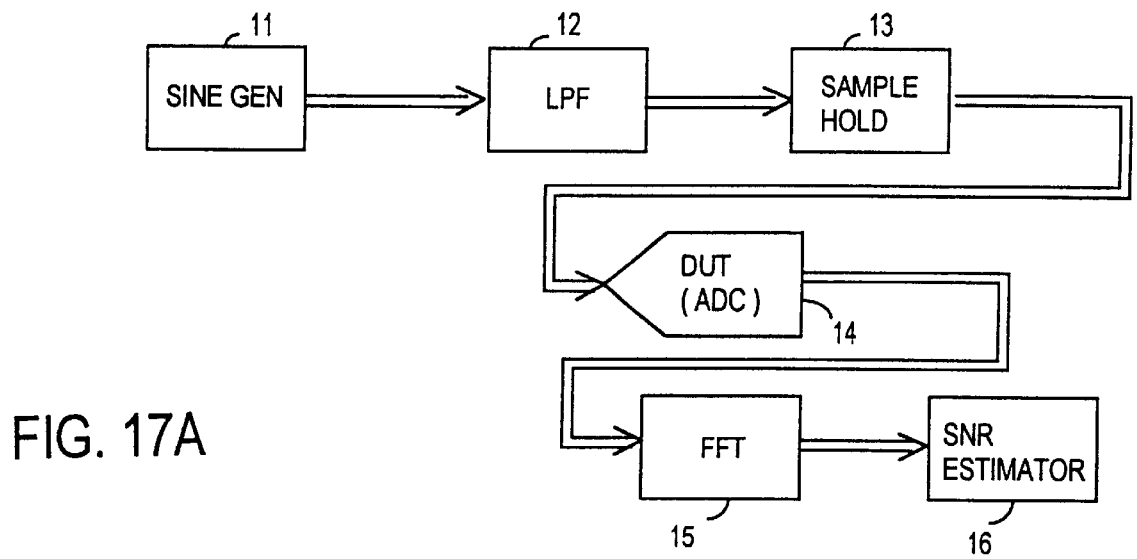
FIG. 17A is a block diagram showing one form of an ADC evaluation system which estimates the effective number of bits using a conventional technique.
Figure 17B:
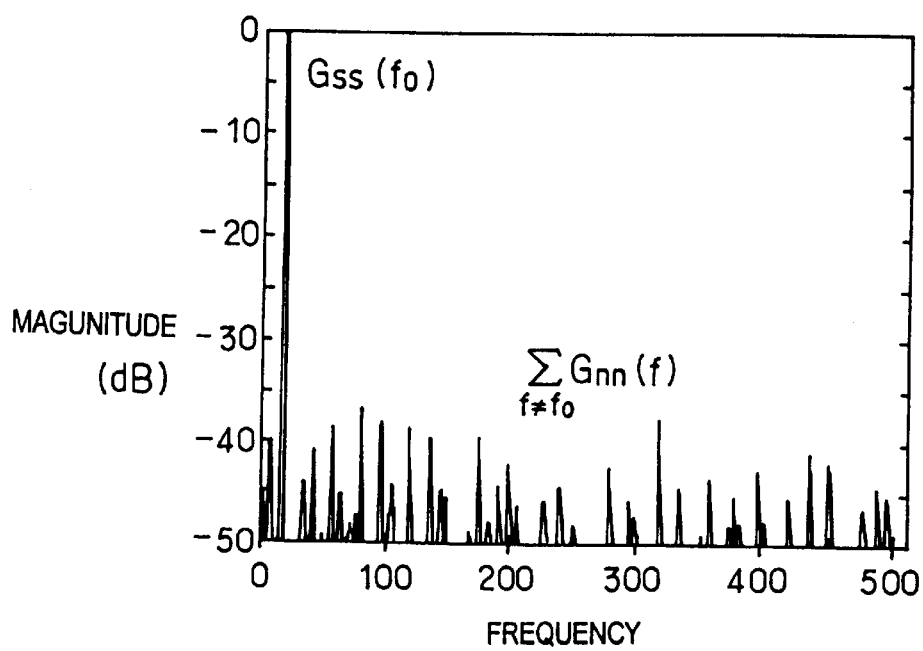
FIG. 17B is a diagram showing an example of fast Fourier transform of an output from the ADC.

The "number of samples pi per period" is used as a control input to the peak finder 23. If "$p_i$>1", a processing for a maximal value takes place. When the absolute magnitudes of pi results of Wavelet transform which correspond to the scale level ($K_{MAX}^{-i}$) are supplied, (a) a logarithm of the absolute value of only a maximal value is formed to estimate and deliver an instantaneous effective number of bits B according to the equation (10), and (b) zeros are delivered for the remaining ($p_i$−1) data. If "$p_i$<1", input data are delivered as zeros. When such a processing operation is applied, it is possible to observe an instantaneous effective number of bits at a maximal value as a function of time. FIG. 16 shows a result of applying a maximal value processing operation when 256 samples are taken from the sine wave over ten periods.

With respect to the evaluation of DAC's, the use of Fourier transform which incorporates a mean square estimator or the curve fitting approach which utilizes a method of least squares cannot accomplish the sixth, the seventh and the eighth object initially mentioned. To accomplish these objects, there is a need for means which can separate non-idealities which are localized in respective input codes to a DAC.

Figure 18:
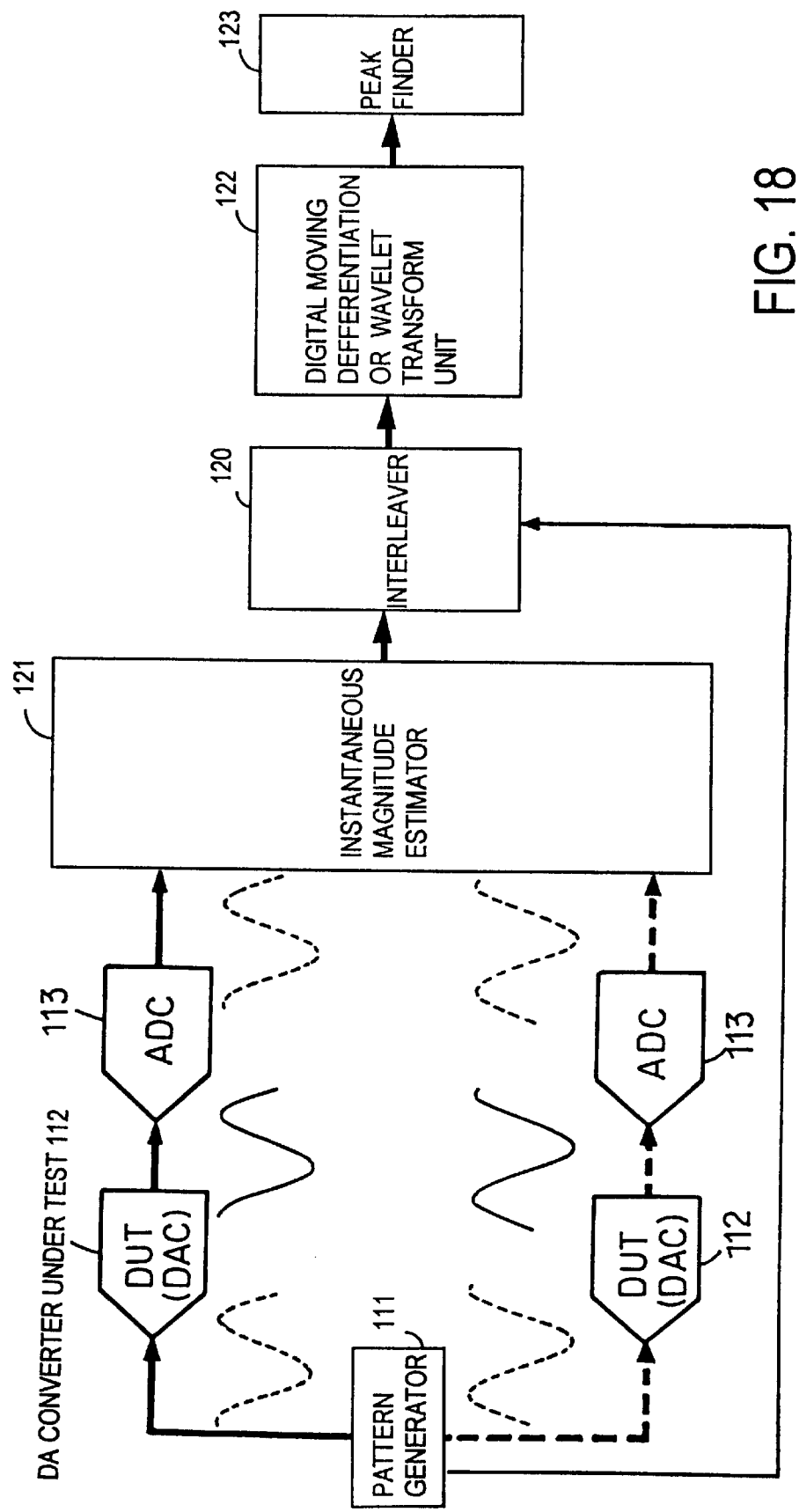
FIG. 18 is a block diagram showing the principle of a DAC evaluation system according to the present invention.

As shown in FIG. 18, in the present invention, an output from DAC under test (DUT) 112 is digitalized with a high precision ADC 113, and an instantaneous magnitude estimator 121 is used which receives the resulting digital signal as an input. The high precision ADC 113 may have a conversion precision which is on the order of ten times higher than the conversion precision of the DAC under test 112, and accordingly, may contain three or four more bits than the DAC 112. The instantaneous magnitude estimator 121 may be constructed and function in the same manner as the instantaneous magnitude estimator 21 used in the ADC evaluation system.

In the prior art practice, a mean effective number of bits of a DAC under test is indirectly estimated by using a combination of a Fourier transform unit and an SNR estimator. In accordance with the present invention, the combination of the Fourier transform unit and the SNR estimator is replaced by a combination of an instantaneous magnitude estimator 121, an interleaver 120, a digital moving differentiator or Wavelet transform unit 122 and a maximal value detector or peak finder 123.

That is, as shown in FIG. 18, in the present invention, a sine wave pattern from a pattern generator 111 is applied to a DAC under test 112, an output analog waveform from the DAC. 12 is digitalized by a high precision ADC 113 and stored in a waveform memory (not shown), and the instantaneous amplitude of the stored waveform is calculated by the instantaneous magnitude estimator 121. The instantaneous amplitude and the known amplitude of the input sine wave are supplied to the interleaver 120, which then produces interleaved signals. The interleaved signals are processed by the moving differentiator or Wavelet transform unit 122, and the absolute magnitude of the output therefrom and the maximum value are determined by the peak finder 125 to be used in determining the instantaneous effective number of bits.

As mentioned previously, the FFT approach or the curve fitting approach cannot directly determine non-idealities which are localized in the respective input codes of the DAC under test. For example, according to the FFT approach, a digital signal comprising output signals from the DAC is subject to the Fourier transform, estimating a line spectrum which corresponds to an ideal sine wave in the frequency domain. A difference spectrum is then determined which corresponds to the spectrum obtained by the Fourier transform, from which the line spectrum is excluded. Finally, the difference spectrum is made to correspond to non-idealities in the DAC under test. Similarly, according to the curve fitting approach, a calculation is repeated so that a square error between the sampled digital waveform and an ideal sine wave is minimized, thus estimating the ideal sine wave. Non-idealities in the DAC under test are estimated by a difference vector formed between the vector of the sampled space waveform and the vector of the ideal sine wave.

By contrast, the instantaneous magnitude estimator 121 is used in accordance with the present invention, and permit non-idealities which are localized in respective input codes to the DAC under test to be directly determined. To simplify the description, it is assumed that the input signal comprises a cosine wave. A digital waveform representing the response from the DAC under test is a sum of the input cosine wave and non-idealities e[n] such as conversion errors of DAC under test.

$$\hat{X}[n] = A \cdot \cos(2\pi f_0 n + \Phi) + e[n] \quad (16)$$

It is to be noted that a digital signal representing the response of the DAC under test in response to the input cosine wave always contains a sine wave which is related to the cosine wave by Hilbert transform.

$$\hat{X}[m] = H(X[n]) + e[m] = A \cdot \sin(2\pi f_0 n + \Phi) + e(m) \quad (17)$$

When and are supplied to the instantaneous magnitude estimator, the latter calculates and delivers the instantaneous amplitudes z(n).

$$z(n) \equiv \sqrt{\hat{X}[n]^2 + \hat{X}[m]^2} \quad (18)$$
$$\cong A + \{e[n] \cdot \cos(2\pi f_0 n + \Phi) + e[m] \cdot \sin(2\pi f_0 n + \Phi)\}$$

e[n] or e[m] is equal to zero for an ideal DAC having an infinite number of bits, whereby an envelope of a given amplitude A is provided. Conversely, a DAC under test which has a finite number of bits provides an envelope of an error signal as indicated in FIG. 2A. Thus, it may be regarded as having the cosine wave and the sine wave in the input signal as carrier waves, the amplitude of which is modulated in accordance with e[n] or e[m] representing the non-idealities in the DAC under test. Accordingly, information representing a fault of the DAC under test appears in the amplitude modulation signal term in the equation (18).

In the dynamic performance test for the DAC under test, it is more important to evaluate the worst value rather than determining a mean value of the effective number of bits. The estimation of the worst number for the effective number of bits may utilize a maximum or minimum value in the amplitude modulation signal given by the equation (18).

$$-\Delta/2 < e[n] < \Delta/2 \quad (19\text{-}1)$$

This inequality can define a range of the amplitude modulation signal as given below:

$$A - \sqrt{2}(\Delta/2) < z[n] < A + 2(\Delta/2) \quad (19\text{-}2)$$

When a maximal value and a minimal value in the amplitude modulation signal given by the equation (18) is utilized in evaluating the worst number of the effective number of bits of the DAC under test, the instantaneous value of the effective number of bits which corresponds to the period of the input sine wave can be determined. For example, a glitch occurs as a result of a large transition in the digital code which is input to the DAC. On the other hand, noises occur without any correlation with the input signal. Thus, by seeing if the fault appearing in the amplitude modulation signal is periodic, or remains substantially constant, or comprises noise on which a periodic pattern is superimposed, it is possible to determine if a single fault or a compounded fault prevails. In this manner, the instantaneous magnitude estimator which is used in accordance with the present invention enables direct determination of non-idealities which are localized in the respective output codes of the DAC under test.

Assuming a number of samples which is equal to 512, the required volume of computation will be as follows:

FFT approach: 4092 real number multiplications and 7668 real number additions;

curve fitting approach: 6656 real number multiplications and 4092 real number additions;

instantaneous magnitude estimator: 1024 real number multiplications and 512 real number additions.

In this manner, the instantaneous magnitude estimator used in accordance with the present invention provides a system and method which accomplish the first, the second and the third object mentioned previously.

The function of and the effect brought forth by a digital moving differentiator will now be described. A single pulse signal $1 - \Delta\delta(t-\tau)$ (FIG. 2B) having an amplitude of an output step size $\Delta$ is input to the digital differentiator, and only 512 samples are sampled. The impulse signal having an amplitude equal to the output step size corresponds to a minimum output signal from the DAC. As shown in FIG. 2C, it is possible to observe $-20 \log_{10}(\Delta/2)$ which is proportional to the output step size of the DAC.

Similarly, a single pulse signal $1 - \Delta\delta(t-\tau)$ having an amplitude for the output step size $\Delta$ is input to the Wavelet transform unit, and only 512 samples are sampled. As shown in FIG. 3, $-20 \log_{10}(\Delta/2)$, $-20 \log_{10}(\Delta/4)$, . . . , $-20 \log_{10}(\Delta/256)$ which are proportional to the output step size of the DAC are observable in multiple resolutions corresponding to 8 scales. A scale is the reciprocal of the frequency, which changes from $2^8$ to $2^1$ in this example. Conversely, it is seen that $2^1$ to $2^8$ Wavelets exist along the time axis. The number of Wavelets which corresponds to the frequency, or "m" of $2^m$ is referred to as a level. However, it is to be noted that Martin Vetterli et al refers to a scale which corresponds to the period, or "j" of $2^j$ is as a level.

FIG. 3B shows a result of Wavelet transform as observed at each scale level. It will be seen that $\Delta = V_{REF}/2^B$, B=DR/20 $\log_{10} 2$. Accordingly, it will be seen that the use of the digital moving differentiator or the Wavelet transform unit enables a determination of whether or not the output step size is working properly. If the single pulse signal is subject to the Fourier transform, the spectrum will be spread across the entire frequency band of observation, preventing a detection of whether or not the output step signal of the ADC is working properly. It will be noted that in each logarithmic frequency zone shown in FIG. 3B (for example, (0,1), (1,2), . . . , (6,7), and (7,8)), the total time range (0 to 250) is observed in a compressed manner.

Assuming a number of samples which is equal to 512, the required volume of computation will be as follows:

digital moving differentiator: 1022 real number multiplications and 511 real number additions;

Daubechies-Wavelet transform unit: 4088 real number multiplications and 3066 real number additions.

The function of and the effect brought forth by the interleaver will be described. When the amplitude modulation signal z(n) given by the equation (18) and the amplitude A of the cosine wave applied are supplied to the interleaver, it delivers the following signal f:

$$f \equiv (A, z(1), A, z(2), \ldots, A, z(n), \ldots)$$

The signal f is a train of sub-signals (A, z(n)) or an impulse train having a height of A−z(n). It will be seen from the theory of the single pulse signal mentioned above that the height of the impulse train can be estimated by supplying the signal f to the digital moving differentiator or the Wavelet transform unit.

A maximum value of the output from the digital moving differentiator or Wavelet transform unit provides a dynamic range of DAC under test.

$$DR \equiv -20\log_{10}\left[\frac{1}{2^{\hat{B}+0.5}}\right][dB] \quad (20)$$

Conversely, the instantaneous effective number of bits B of the DAC under test can be estimated from the value of DR observed.

$$B=(DR/20 \log_{10} 2)-0.5[bit] \quad (21)$$

When the amplitude modulation signal given by the equation (18) is input to the digital moving differentiator or Wavelet transform unit (FIG. 18), the instantaneous effective number of bits can be observed as a function of time as indicated in FIG. 4A. In addition, the absolute magnitude of the output from the digital moving differentiator or Wavelet transform unit may be determined and input to the peak finder, thereby allowing the instantaneous effective number of bits to be estimated in accordance with the equation (21) from the maximum value delivered.

The number of bits in the DAC under test is changed from 2 to 22 for purpose of verifying the process of estimating the instantaneous effective number of bits. The result is indicated in FIG. 4B where "+" indicates an instantaneous effective number of bits which is estimated in response to an input of a single pulse signal and "O" represents an instantaneous effective number of bits which is estimated by supplying the sine wave to the DAC under test and using the combination of the instantaneous magnitude estimator, the digital moving differentiator or Haar-Wavelet transform unit and the peak finder. In this Figure, "*" represents an instantaneous effective number of bits which is estimated by supplying the sine wave to the DAC under test and using the combination of the instantaneous magnitude estimator, the Daubechies Wavelet transform unit and the peak finder. It will be seen that in each instance, an instantaneous effective number of bits which corresponds to the number of bits of the DAC under test is estimated.

In this manner, the combination of the instantaneous magnitude estimator and either the digital moving differentiator or Wavelet transform unit which are used in accordance with the present invention provides a system which accomplishes the fourth and the fifth object mentioned previously.

The instantaneous magnitude estimator according to the present invention provides (1) an instant effective number of bits estimator which is capable of independently dealing with factors in a compounded fault, (2) an effective number of bits estimator which permits an arbitrary choice of the testing frequency, and (3) an effective number of bits estimator which can be implemented in a simple hardware.

In addition, a combination of the instantaneous magnitude estimator and either the digital moving differentiator or Wavelet transform unit according to the present invention provides (4) an effective number of bits estimator which allows a high accuracy of determination to be obtained without increasing the length of time, and (5) a system which permits the observation of the instantaneous effective number of bits as a function of time.

Preferred embodiments of the present invention will be described in more detail with reference to the drawings.

Figure 19:
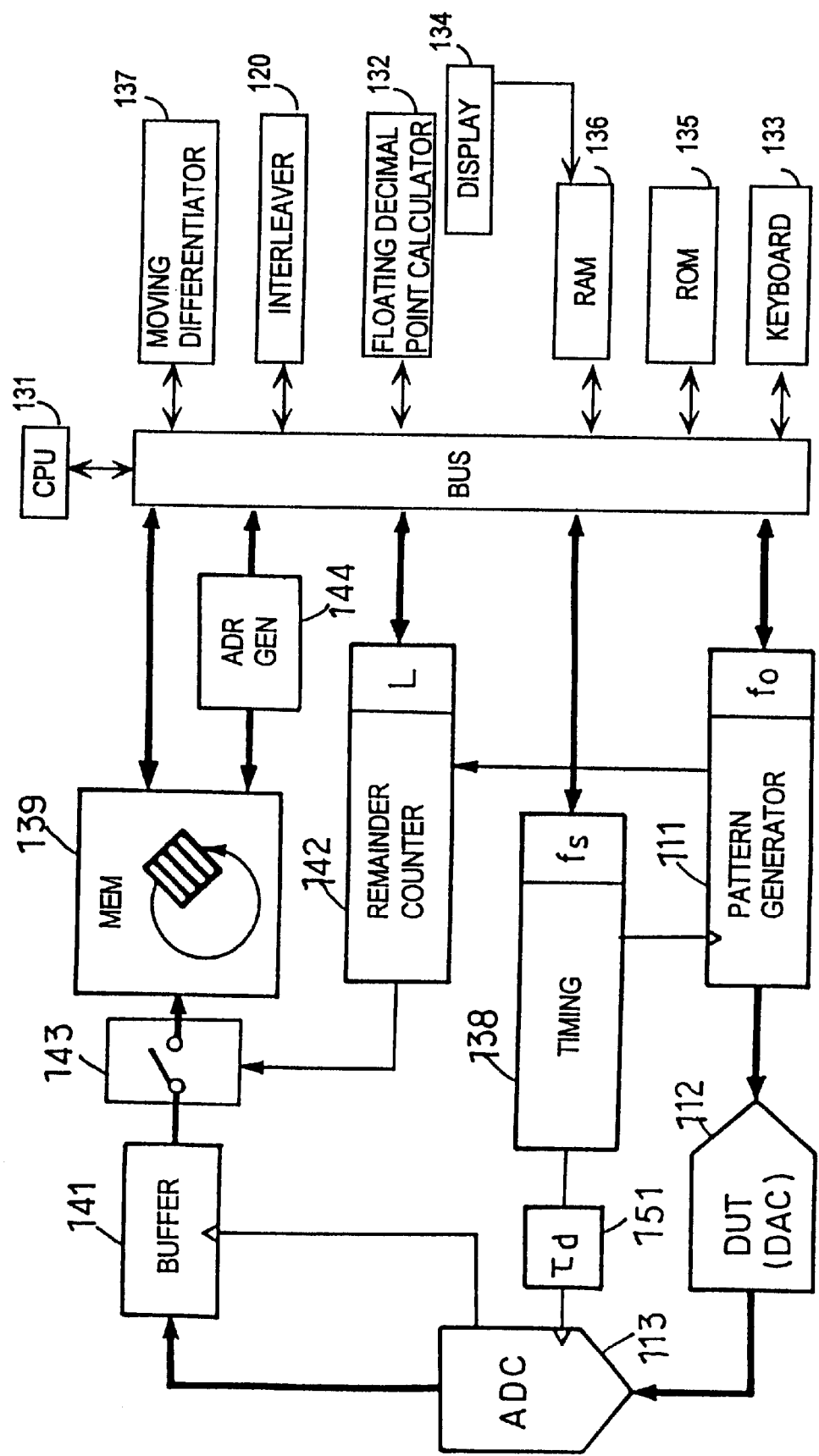
FIG. 19 is a block diagram of an essential part of a first embodiment of the DAC evaluation system according to the present invention.

FIG. 19 shows the arrangement of an effective number of bits estimator in accordance with the present invention. The arrangement comprises a CPU 131 which performs data entry or delivery and calculations, a floating decimal point calculator chip 132, a keyboard or a front panel 133 which is used to enter parameters or instructions, a display 134 which displays a menu selected by a user or results of determination, an ROM 135, RAM 136 or disk unit which store inputs from the user or other data. In addition, the arrangement includes an interleaver 120 and a digital moving differentiator 137. A pattern generator 111 which generates a pattern signal generates a sine wave, which is applied to a DAC 112 under test. A timing controller 138 generates a clock, which is supplied to a high precision A/D converter 113, thus controlling the timing when the A/D conversion of analog signal delivered from the DAC 112 takes place. A waveform memory (RAM Signal) 139 reads a digital signal-which is accumulated in a buffer 141 connected to the output of the ADC 113 in synchronism with an end of conversion signal delivered from the ADC 113, for example. The waveform memory 139 may be assumed to have a size of 1024, for example, thus having memory addresses of 0-1023. The pattern generator 111 also generates a trigger signal, which starts a remaining sample counter 142, and when the count in the counter 142 becomes equal to zero, for example, a switch 143 which couples the buffer 141 to the waveform memory 139 is turned off, thus terminating the write-in of the digital signal into the waveform memory 139. If the last write-in address to the waveform memory 139 were 500 (or 1023) at this time, the last write-in address is read out from an address generator 144 and is incremented by one to preset the remainder calculation, thus providing an address of 501 (or 0) where an oldest sample is stored. Thus, when the last write-in address to the waveform memory 139 is read out from the address generator 144 and is incremented by one, each sample can be read out in sequential order beginning with the oldest sample.

The frequency $f_0$ and the amplitude A of the sine wave, the sampling frequency $f_S$ and the number of remaining samples L which is preset as a trigger condition can be selected by a user through the keyboard 133 or front panel. These parameters may also be written into a file saved in a disc and read from this file upon commencement of the test. CPU 131 write these parameters into control registers associated with the signal generator 111, a low pass filter 112 or the waveform memory 139.

Figure 20:
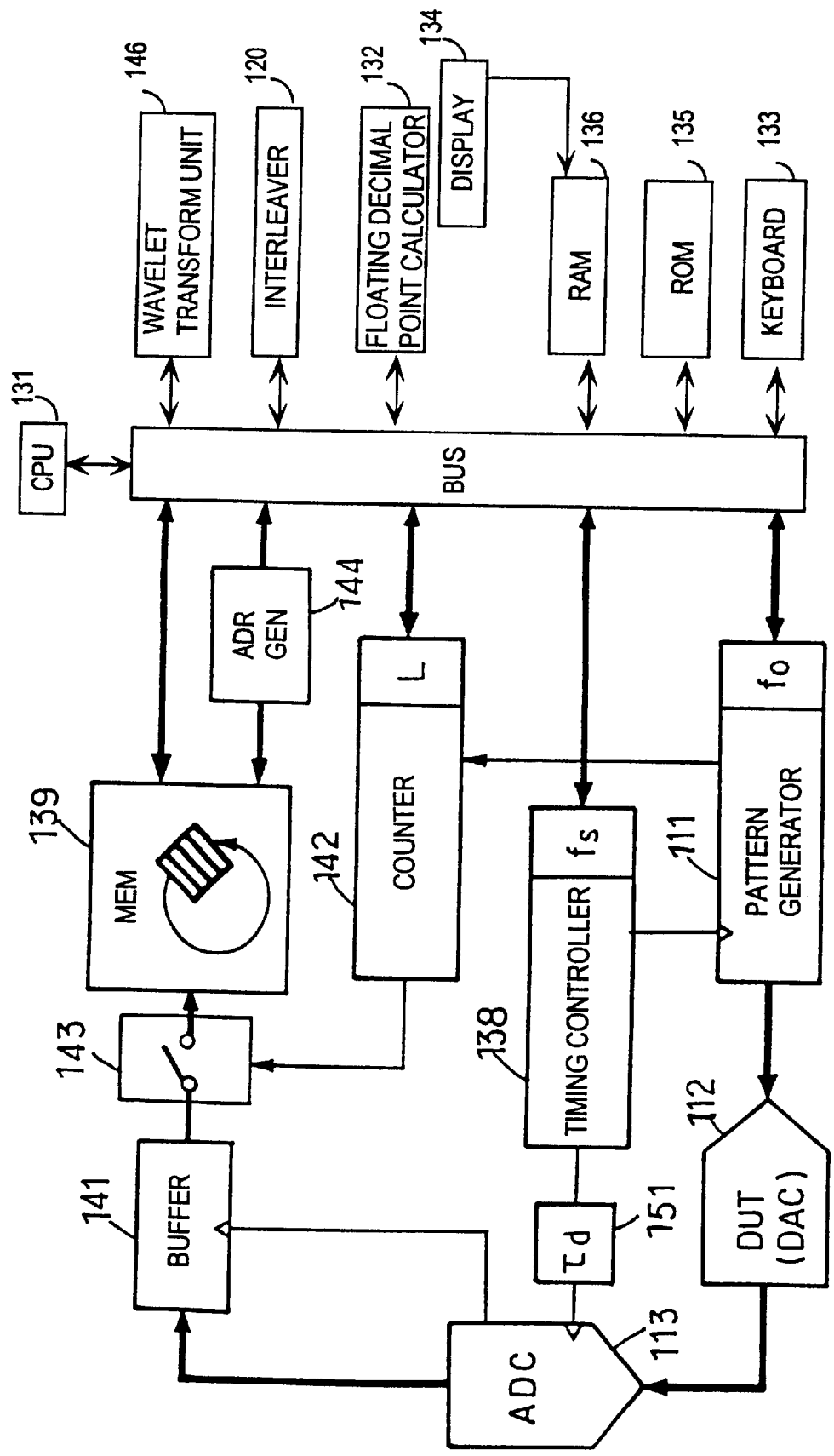
FIG. 20 is a block diagram showing an essential part of a second embodiment of the DAC evaluation system according to the present invention.

FIG. 20 shows the arrangement of another form of an effective number of bits estimator according to the present invention, and parts corresponding to those shown in FIG. 19 are designated by like reference characters as used in FIG. 19. The difference over the arrangement of FIG. 9 lies in that the digital moving differentiator 37 shown in FIG. 19 is replaced by Wavelet transform unit 146 in FIG. 20.

Figure 21:
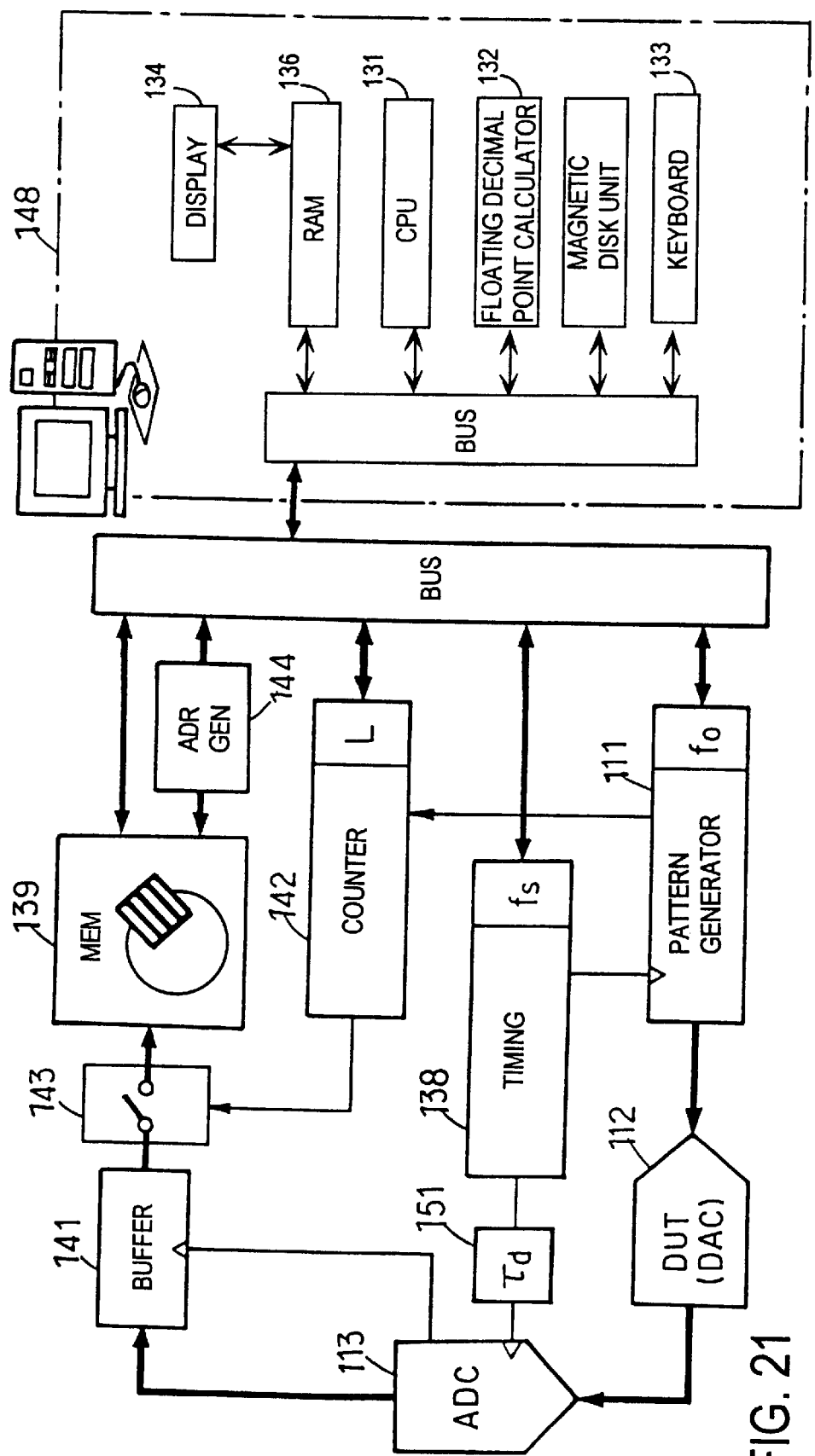
FIG. 21 is a block diagram showing an essential part of a third embodiment of the DAC evaluation system according to the present invention.

FIG. 21 shows the arrangement of a further form of an effective number of bits estimator according to the present invention. A distinction over the arrangements shown in FIGS. 19 and 20 lies in the provision of a control computer 148 which exercises a control over the effective number of bits estimator. The control computer 141 may comprise SPARC computer available from Sun Microsystems, and serves the functions of the CPU 131, the floating decimal point calculator chip 132, the keyboard 133, the display 134, the ROM 135, the RAM 136, the interleaver 120 and digital moving differentiator 137 or the Wavelet transform unit 146 shown in FIGS. 19 and 20.

Embodiment 1

Figure 22A:
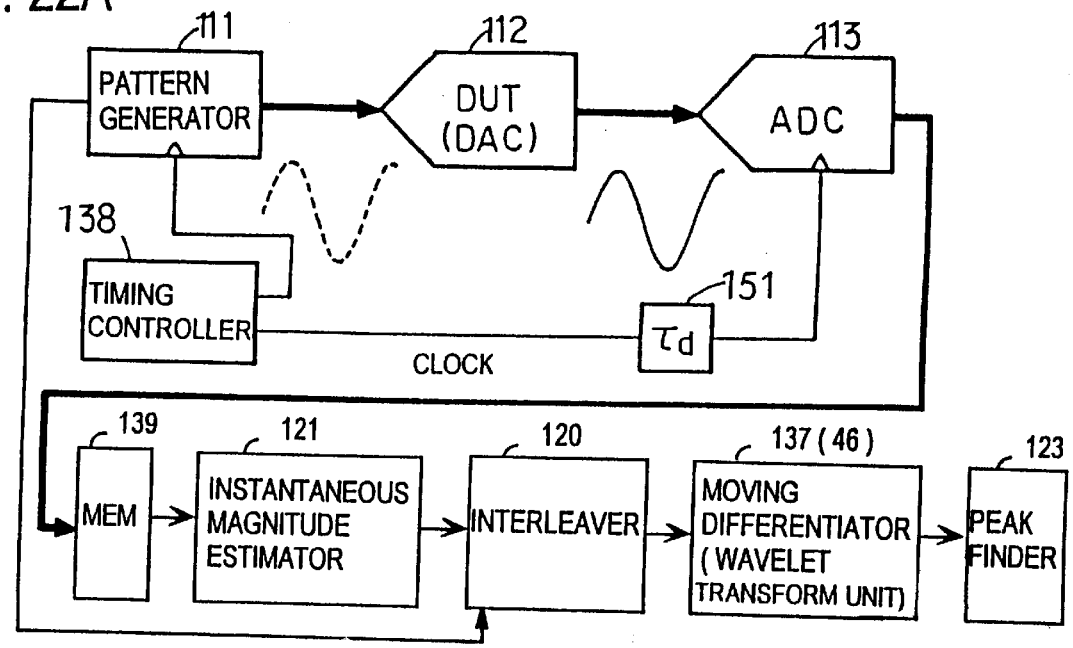
FIG. 22A is a block diagram showing the overall arrangement of one form of the DAC evaluation system according to the present invention.

FIG. 22A shows a schematic view of an effective number of bits estimator according to the present invention. A pattern generator 111 which generates a digital signal generates a sine wave pattern, which is applied to a DAC under test 112. A timing controller 138 generates a clock which is supplied to a high precision ADC 113 for controlling the timing of operation of the ADC 113 which performs an A/D conversion for the output from the DAC 112. A waveform memory or RAM 139 accumulates a digital signal from the ADC 113 in synchronism with an end of conversion signal delivered from the ADC 113, for example. An instantaneous magnitude estimator 121 forms a suitable pair of data $\hat{X}[n]$ and $\hat{X}[m]$ from the array of digital waveform supplied from the waveform memory, determines a sum of squares and forms a square root of the sum of the squares to calculate an instantaneous amplitude z(n) in accordance with the equation (18).

The array of instantaneous amplitudes is supplied as an input to an interleaver 120, which then produces an interleaved signal from the amplitude A of the sine wave and the array of instantaneous amplitudes. The interleaved signals are supplied as an input to a digital moving differentiator 137, which then calculates a moving difference between adjacent interleaved signals, thus sequentially delivering a difference between a current input value and an immediately preceding input value. Since the input interleaved signals are formed in the order of ( . . . , A, z(n), A, . . . ), a difference having the same absolute value |A−z(n)| may be delivered twice in succession. To prevent this, the digital moving differentiator 37 is designed to deliver one sample every two samples, thus assuring that the difference represented by the absolute value |A−z(n)| is delivered only once. To summarize, the instantaneous amplitudes comprising M samples are input to the interleaver 120, the output of which is processed by the digital moving differentiator 137, providing an output having M samples. A peak finder 123 receives the array of difference signals as its input, detects and delivers a maximum amplitude. A logarithm of the detected maximum amplitude may be formed and substituted into the equation (21) as representing dB value, thereby allowing the instantaneous effective number of bits B to be estimated.

As indicated in parentheses, the moving differentiator 137 may be replaced by a Wavelet transform unit 146.
Embodiment 2

Figure 22B:
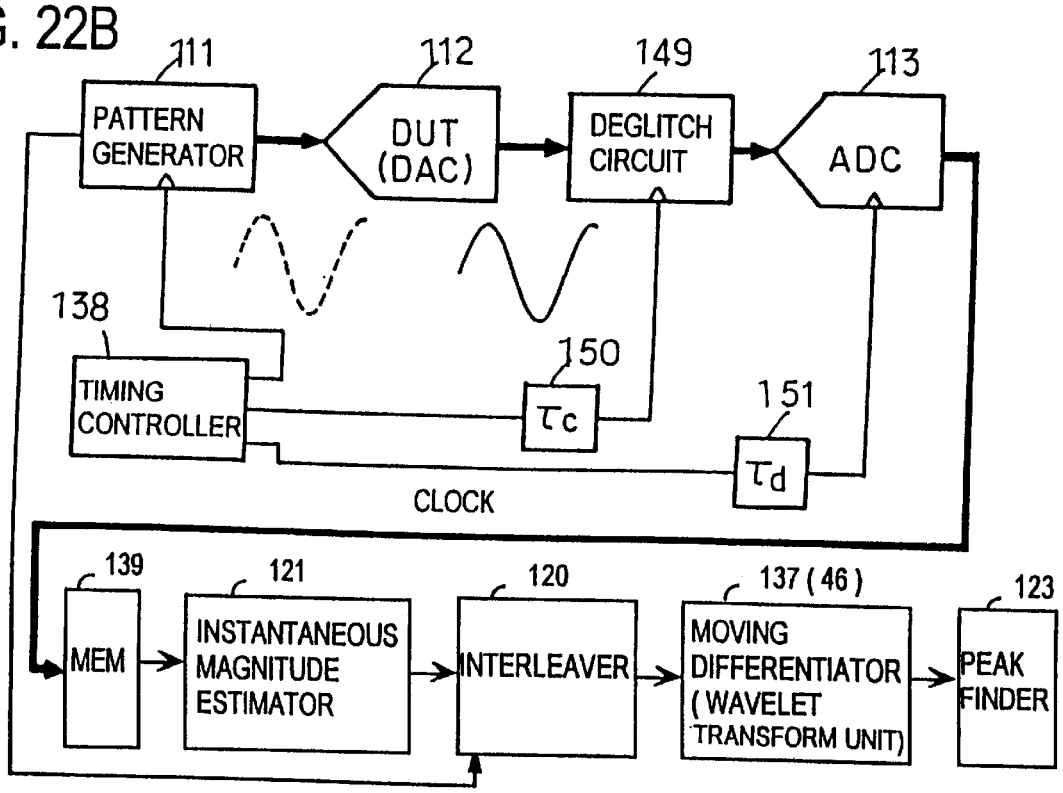
FIG. 22B is a block diagram showing the overall arrangement of another form of DAC evaluation system according to the present invention.

FIG. 22B shows an embodiment in which a deglitch circuit (sample-and-hold circuit) 149 is added to the arrangement of FIG. 22A. A sine wave pattern from a pattern generator 111 is applied to a DAC 112 under test in synchronism with a clock supplied from a clock generator 138. An analog signal which is output from the DAC 12 has any glitches removed by the deglitch circuit 149 before it is supplied to an ADC 113. A waveform memory 139 accumulates a digital signal from the ADC 113. A conversion operation of the ADC 113 is delayed by one clock by means of a delay element 151 so that the conversion takes place in a stabilized condition of the sample-and-hold circuit within the deglitch circuit 149. In other respects, the arrangement is similar to that shown in FIG. 22A. Accordingly, the moving differentiator 137 may be replaced by Wavelet transform unit 146.
Embodiment 3

Figure 23:
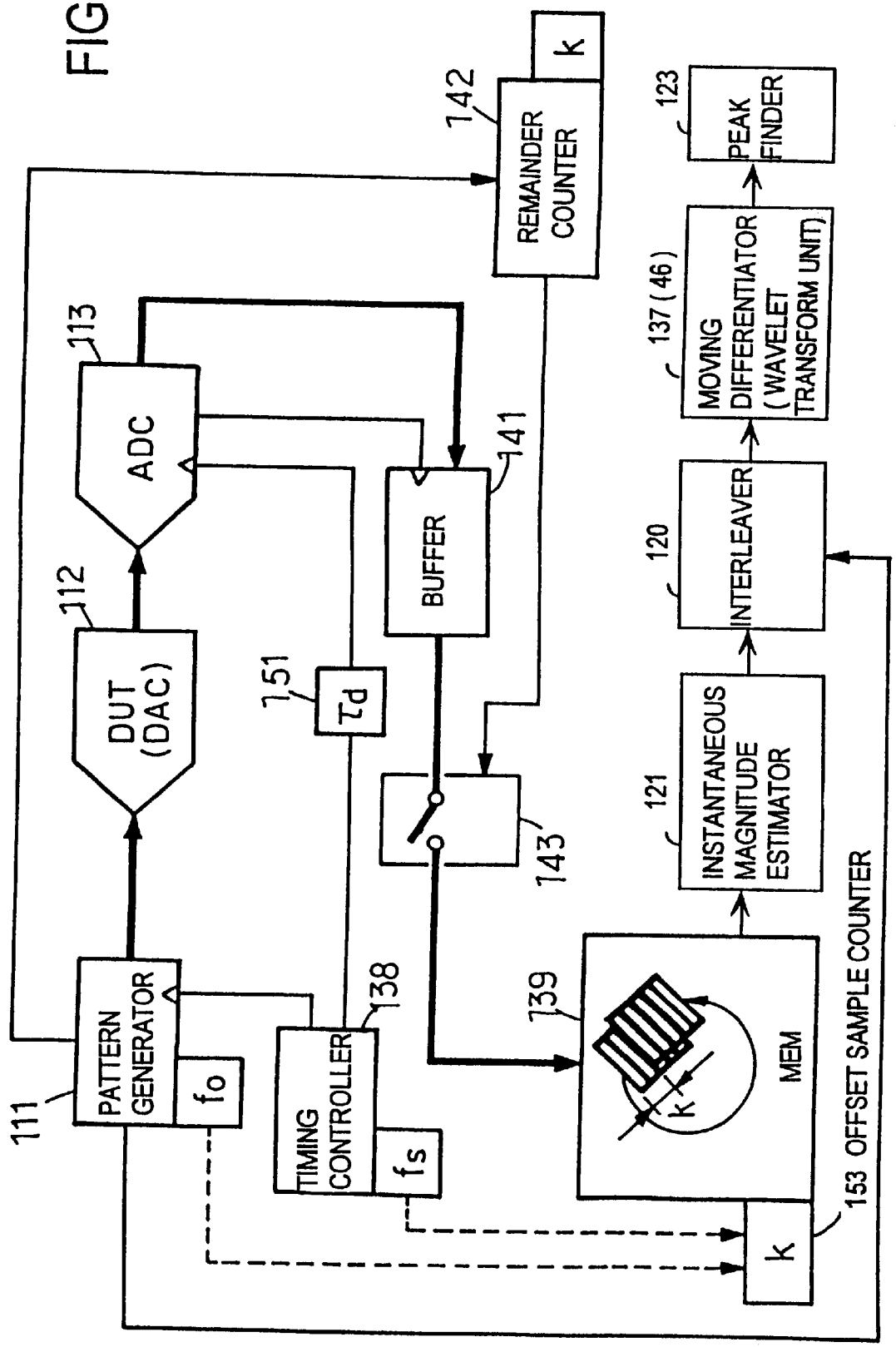
FIG. 23 is a block diagram showing one form of memory and parts located therearound which are used in the DAC evaluation system shown in FIG. 22 in detail.

FIG. 23 shows parts disposed around the waveform memory in the system of the present invention in detail. A sine wave pattern from a pattern generator 111 is applied to a DAC under test 112, and a waveform memory 139 accumulates a digital signal from the ADC 113.

A: Signal Capture Through Trigger

The pattern generator 111 also generates a trigger signal, which starts a remaining sample counter 142 in which a number of remaining samples L is preset. The count in the counter 142 is decremented by one each time a sample is received. When the count in the counter 142 becomes equal to zero, a switch 143 coupled to the waveform memory 139 is turned off, thus terminating the write-in of the digital signal into the waveform memory 39.

B: Signal Capture Through Internal Timing

CPU 131 shown in FIG. 19 or 20 or the control computer 148 shown in FIG. 21 executes a command selected by a user or a command from a file which is read from the disc together with an associated subsystem. When a command "hold an input signal" is given, the CPU or the control computer turns the switch 143 which is coupled to the waveform memory 139 off, thus terminating the write-in of the digital signal into the waveform memory 139.

In either instance, a read-out of the digital waveform from the waveform memory 139 takes place as follows:

It is initially assumed that the waveform memory 139 has a size of 1024, thus having the memory addresses of 0 to 1023. If the last write-in address to the waveform memory 139 were 500 (of 1023), the last write-in address may be read out from the address generator 144 and incremented by one for a remainder operation to provide an address of 501 where an oldest sample is stored. Thus, when the last write-in address to the waveform 139 is read out from the address generator and incremented by one, the respective samples can be read out in a sequential order beginning with the oldest sample.

A device 153 for calculating "a number of offset samples between waveform memories which store digital waveforms having a phase difference of 90° therebetween" which corresponds to the cosine wave and the sine wave may be supplied with the frequency $f_0$ of the sine wave and the sampling frequency $f_S$ of the ADC 113 to calculate "a number of offset samples k between the waveform memories 139 which store the digital waveforms having a phase difference of 90° therebetween"

$$k=[f_S/(4\,f_0)] \quad (22)$$

where [y] represents a maximum integer equal to or less than y.

An instantaneous magnitude estimator 121 receives a digital waveform for (M+k) samples from the waveform memory 139 where M represents "a number of samples selected to estimate the effective number of bits" and k represents "a number of offset samples" which is determined by the number of offset samples calculator device 153. The instantaneous magnitude estimator 121 then forms pairs of $\hat{X}[0]$ and $\hat{X}[k]$, $\hat{X}[1]$ and $\hat{X}[k+1]$, . . . , $\hat{X}[M]$ and $\hat{X}[M+1]$, which are taken from the array of digital waveforms by incrementing by one to preset the remainder, determines a sum of squares, and forms a square root of the sums of squares to calculate an instantaneous amplitude z(n) according to the equation (18).

The array of instantaneous amplitudes thus formed is input to an interleaver 120 where interleaved signals are produced using the amplitude A of the sine wave and the array of instantaneous amplitudes.

Interleaved signals produced by the interleave 120 are input to a digital moving differentiator 137, which then operates to calculate a moving difference between the interleaved signals. The array of difference signals is then input to a peak finder 123 where a peak amplitude is detected and delivered. A logarithm of the detected maximum amplitude is formed and is substituted into the equation (21) to estimate an instantaneous effective number of bits B.

Alternatively, the instantaneous amplitudes z(n) which are determined by the instantaneous magnitude estimator 121 may be input to the digital moving differentiator 137 in the sequence of time in order to calculate a moving difference between it and its immediately preceding instantaneous amplitude z(n−1). The peak finder 123 receives the moving differences, compares the moving difference against the prevailing maximum value that is stored therein, and chooses a greater one to store and delivers it as a maximum amplitude. By forming a logarithm of the detected maximum amplitude, an instantaneous effective number of bits B can be estimated according to the equation (21). As indicated in parentheses, the moving differentiator 137 may be replaced by a Wavelet transform unit 46. In this instance, M mentioned above represents a number of Wavelet transformed samples.

Embodiment 4

Figure 24:
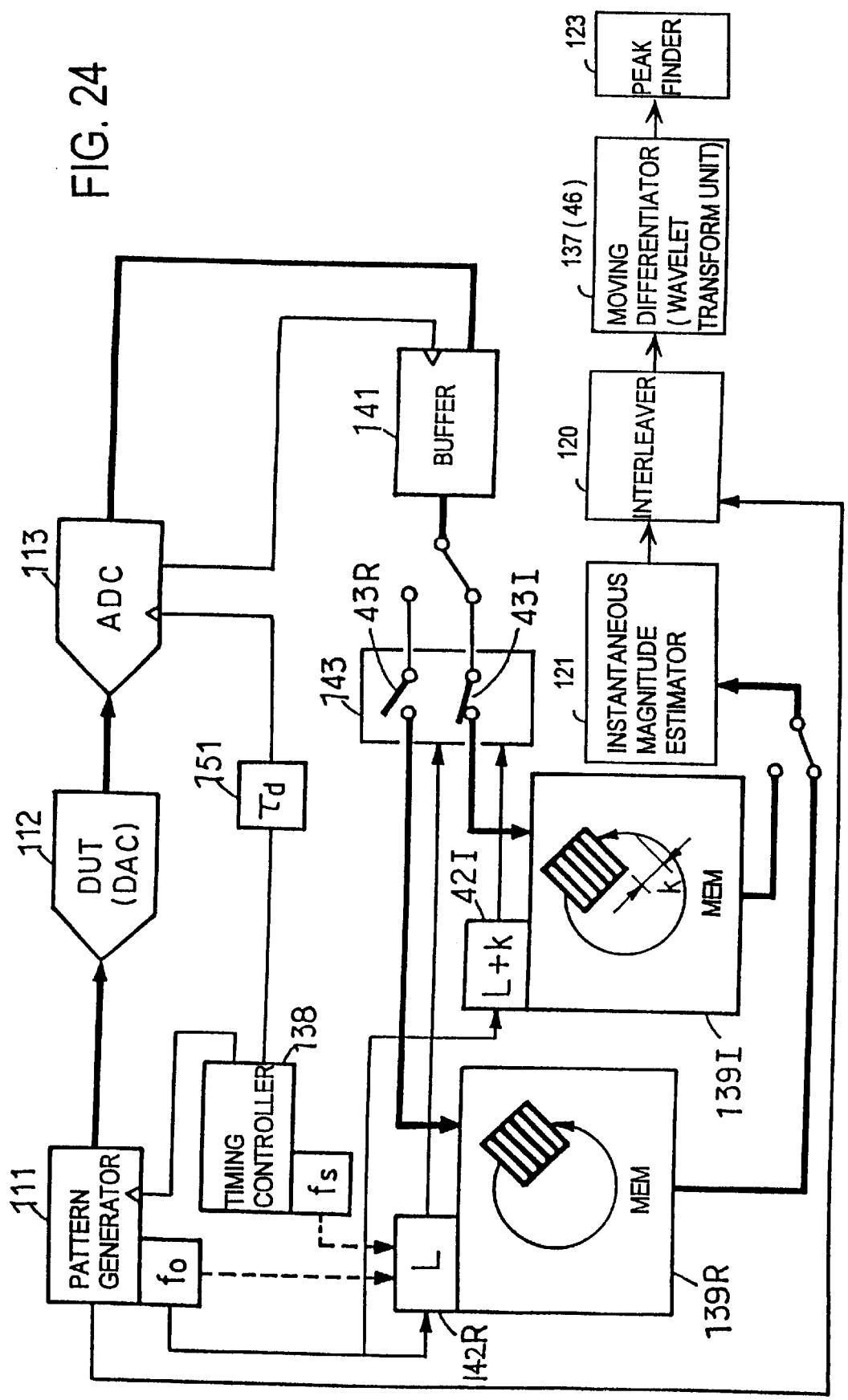
FIG. 24 is a block diagram showing another form of memory and parts located therearound which are used in the DAC evaluation system shown in FIG. 22 in detail.
Figure 25:
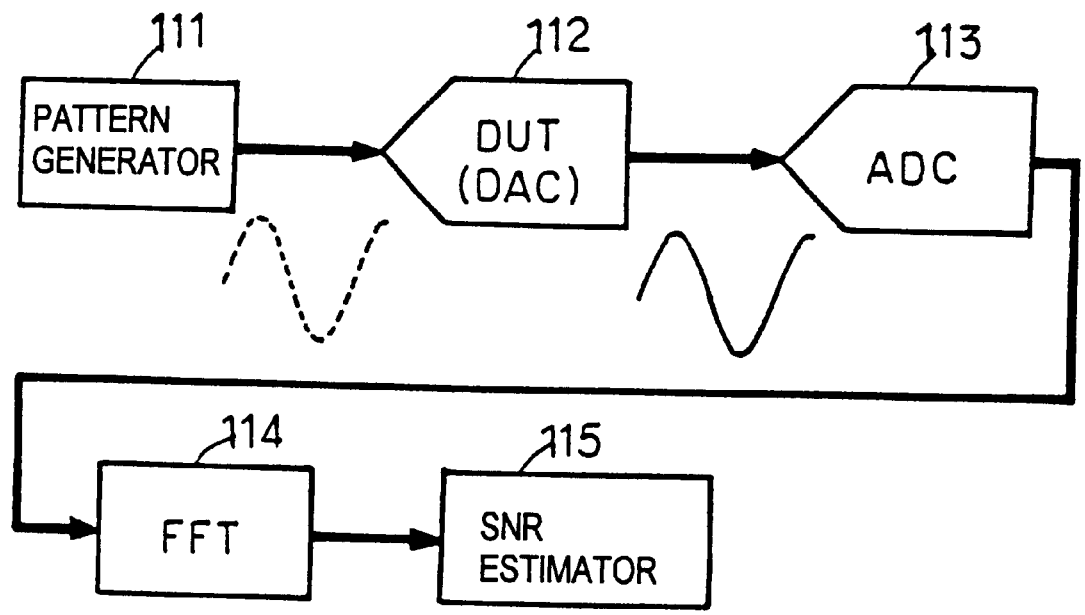
FIG. 25 is a block diagram of an example of a DAC evaluation system which estimates the effective number of bits using a conventional FFT technique.

FIG. 24 shows parts disposed around a waveform memory 139 in the system of the present invention in detail. A real part waveform memory 139R has a remaining sample counter 142R associated therewith in which a number of remaining samples L is preset. A device for calculating "a number of offset samples between digital waveforms having a phase difference of 90° therebetween" which correspond to the cosine wave and the sine wave may be supplied with the frequency $f_0$ of the sine wave and the sampling frequency $f_S$ of an ADC 113 to calculate "a number k of offset samples in the digital waveform having a phase difference of 90° therebetween" according to the equation (22). An imaginary part waveform memory 139I has a remaining sample counter 142I associated therewith which is preset to L+k. The waveform memory 139 is associated with a selection switch 143, which is assumed to be now selecting the real part waveform memory 139R. A pattern generator 111 which generates a digital signal generates a cosine wave, which is applied to a DAC under test 112. The real part waveform memory 139R accumulates a digital signal from the ADC 113. The pattern generator 111 also generates a trigger signal, which starts remaining sample counters 142R and 142I, and when the count in the counter 142R becomes equal to zero, for example, a switch 143R coupled to the real part waveform memory 139R is turned off, thus terminating the write-in of the digital signal into the real part waveform memory 139R. A selection switch 143I associated with the waveform memory 139 then selects the imaginary part waveform memory 139I. The pattern generator 111 generates a cosine wave, which is then applied to the DAC under test 112. The imaginary part waveform memory 149I accumulates a digital signal from the ADC 113. Similarly, a trigger signal generated by the pattern generator 111 starts the remaining sample counter 142I, and when the count in the remaining sample counter 142I becomes equal to zero, for example, a switch 143I coupled to the imaginary part waveform memory 149I is turned off, thus terminating the write-in of the digital signal into the imaginary part waveform memory 139I. The sine waves for the imaginary part is stored in the waveform memory 139I for the number of offset samples k.

An instantaneous magnitude estimator 121 takes digital waveforms for M samples each from the real part waveform memory 139R and the imaginary part waveform memory 139I where M represents "the number of samples selected to estimate the effective number of bits". Instantaneous magnitude estimator 121 then forms pairs of $\hat{X}.re[0]$ and $\hat{X}.im[0]$, $\hat{X}.re[1]$ and $\hat{X}.im[1]$, ..., $\hat{X}.re[M]$ and $\hat{X}.im[M]$ from the array of digital waveforms which it has received by incrementing by one for the remainder operation, and determines a sum of squares. It then forms a square root of the sum of squares to determine an instantaneous amplitudes array.

$$z(n) = \sqrt{\hat{X}.re[n]^2 + \hat{X}.im[n]^2} \qquad (23)$$

The array of instantaneous amplitudes is input to an interleaver 120, which then produces interleaved signals using the amplitude A of the sine wave and the array of instantaneous amplitudes.

The operation of a digital moving differentiator 137 and a peak finder 123 remains similar to that mentioned above. However, in FIG. 24, the moving differentiator 137 may be replaced by a Wavelet transform unit 146, as indicated in parentheses. In this instance, M mentioned above represents a number of Wavelet transformed samples.

A specific example of the digital moving differentiator 137 is shown in FIG. 11, and is non-cyclic filter represented by the following equation:

$$y(n) = h(N) \times (n-N) + h(N-1) \times (n-N+1) + \ldots + h(1) \times (n-1) + h(0) \times (n) \qquad (24\text{-}1)$$

where it may be assumed that $h(0) = \frac{1}{2}$, $h(1) = -\frac{1}{2}$ and other filter coefficients are $h(2) = \ldots = h(N) = 0$, resulting in a differential filter given by the following equation:

$$y(n) = -(\tfrac{1}{2})x(n-1) + (\tfrac{1}{2})x(n) \qquad (24\text{-}2)$$

Thus, x(n) is supplied to a multiplier 61 and a one sample period delay element 62, the output of which is supplied to a multiplier 63. In the multipliers 61 and 63, the respective input is multiplied by a factor of $h(0) = \frac{1}{2}$, and $h(1) = -\frac{1}{2}$, respectively, and individual results of multiplications are added together in an adder 64 to provide an output y(n). In this manner, the difference between the current value x(n) and an immediately preceding value x(n−1) of the input signal represents the output signal. A procedure for determining optimum filter coefficients is described in "Discrete-Time Signal Processing", by Alan V. Oppenheim, Ronald W. Schafer, Prentice-Hall, 1989, in particular, 7.5.2 Discrete-Time Differentiators. The differential filter may be implemented as a digital filter shown in FIG. 16 or a digital moving differentiator which is used to perform a calculation according to the equation (13-2).

A method of observing a time distribution of local maxima in the instantaneous effective number of bits will be described. When M samples are input to a digital moving differentiator, (M−1) differences are delivered as outputs. Accordingly, the period of the difference output corresponds to the period of the input. Using the frequency $f_0$ of the sine wave and the sampling frequency $f_S$ of the ADC 113, "a number of samples p per period" is calculated.

$$p = [f_S/f_0] \qquad (25)$$

The "number of samples p per period" is used as a control input to the peak finder. When p differences represented in absolute magnitudes are input thereto, there takes place a processing operation in the peak finder which comprises (a) forming a logarithm of the absolute magnitude of only a maximal value to estimate and deliver an instantaneous effective number of bits B according to the equation (21), and (b) delivering zeros for the remaining (p−1) data. By such a processing operation, an instantaneous effective number of bits at a maximal value can be observed as a function of time.

FIG. 12 shows a flow of processing which occurs in the Wavelet transform unit 146. Here, Haar base function is used. In this Figure, a normalization coefficient of ½ is used, but a normalization coefficient may be chosen as as $1/\sqrt{2}$ is commonly used. Initially, $n = \log_2 M$ is calculated from M input signals f(i), (i=1, 2, ..., M), thus copying to an interim result a(i) which corresponds to an output signal. Changing k in the manner of k=n, n−1, . . . , 2, 1, for m=$2^{k-1}$, a calculation of x(i)={a(2i−1)+a(2i)}/2 (i=1, 2, . . . , m) is made as a low pass filtering operation, and a calculation of y(i)={−a(2i−1)+a(2i)}/2 (i=1, 2, . . . , m) is made as a high pass filtering operation. The result of these calculations are copied to the interim result a(i). Thus a(i)=x(i), (i=1, 2, . . . , m) and a(i)=y(i), (i=m+1, . . . , 2m) are delivered.

FIGS. 13 and 14 show a flow of processing which takes place in the Wavelet transform unit which uses Daubechies base function. In these flow charts, a scale corresponding to the period or "k" in $2^{k-1}$ is treated as "level k". The algorithm of the Wavelet transform is described in detail in "Wavelets and Subband Coding", by Mathin Vetterli, Jelena Kovacevic, Prentice-Hall, 1995. The implementation of the Wavelet transform in VLSI is reported in "VLSI Implementation of Discrete Wavelet Transform", by Aleksander Grezeszczak, Mrinal K. Mandal, Sethuraman Panchanathan, Tet Yeap, IEEE Trans. Very Large Scale Integration (VLSI) System, Vol. 4, No. 4, 1996.) Accordingly, the Wavelet transform unit may comprise the Wavelet transform unit as shown in FIG. 12 or 13 or VLSI implemented Wavelet transform unit.

FIG. 15A shows a comparison of the number of real number multiplications between the Daubechies Wavelet transform and the fast Fourier transform. The single Daubechies Wavelet transform requires a volume of computation which is substantially equivalent to the volume of computations for performing the Haar Wavelet transform twice. For a number of samples which is equal to 512, the number of real number multiplications will be substantially similar for both Daubechies Wavelet transform and the fast Fourier transform. Above 1024 samples, the number of real number multiplications for the Daubechies Wavelet transform will be less than the number of real number multiplications of the fast Fourier transform.

A method of observing a time distribution of local maxima in the instantaneous effective number of bits will now be described. When M samples are input to the Wavelet transform unit, $M/2(M/2^{i+1})$ results of Wavelet transform will be delivered for a maximum (or general) scale level $K_{MAX}$ ($K_{MAX}$−i). Accordingly, the period of the result of the Wavelet transform corresponds to $\frac{1}{2}(\frac{1}{2}^{i+1})$ times the period of the input. Using the frequency $f_0$ of the sine wave and the sampling frequency $f_S$ of the DAC, "the number of samples pi per period for the scale level ($K_{MAX}$−i)" is calculated.

$$pi = \frac{1}{2}^{i+1}[f_S/f_0] \quad (26)$$

The "number of samples pi per period" is used as a control input to the peak finder 123. For "pi≧1", a maximal value processing operation takes place. Thus, when the absolute magnitudes of pi results of Wavelet transform which correspond to the scale level ($K_{MAX}$−i) are input, (a) a logarithm of the respective absolute magnitude of only a maximal value is formed to estimate and deliver an instantaneous effective number of bits B according to the equation (21), and (b) zeros are delivered for the remaining (pi−1) data. If "pi<1", zeros are delivered instead of input data. By using such operations, the instantaneous effective number of bits at a maximal value can be observed as a functions of time. FIG. 16 shows a result of a maximal value processing operation when 256 samples are taken from the sine wave which extends over ten periods.

What is claimed is:

1. An evaluation system for a D-A converter comprising:
   a pattern generator for generating a sine wave pattern in the form of a digital signal;
   a timing controller for generating a clock which is used in supplying the sine wave pattern to a D-A converter under test;
   an A-D converter having a higher accuracy of conversion than the D-A converter and operative to convert an analog signal outputted from the D-A converter to a digital signal;
   a waveform memory for storing and accumulating a digital signal outputted from the A-D converter;
   instantaneous amplitude calculation means for taking out a digital signal stored in the waveform memory therefrom and determining an instantaneous amplitude;
   interleave signal producing means for receiving the instantaneous amplitude and the amplitude of the sine-wave as its inputs and forming an interleave signal in which the instantaneous amplitude and the amplitude of the sine wave are interleaved; and
   digital moving differentiator means for receiving the interleave signal as its input and calculating a moving difference.

2. The evaluation system for a D-A converter according to claim 1, further comprising a digital signal selecting means for selecting and taking out from the waveform memory either a digital signal the applied signal pattern of which corresponds to a cosine wave or a digital signal the applied signal pattern of which corresponds to a sine wave.

3. The evaluation system for a D-A converter according to claim 2, wherein the instantaneous amplitude calculation means comprises:
   multiplication means for reading a plurality of digital signals from the waveform memory to derive a square signal of a digital signals corresponding to the cosine wave and a square signal of a digital signal corresponding to the sine wave;
   adder means for adding a plurality of square signals to derive a square amplitude signal; and
   square root means for forming a square root of the square amplitude signal to determine an instantaneous amplitude signal.

4. The evaluation system for a D-A converter according to claim 2, wherein the digital moving differentiator means further comprises a combination of absolute value calculating means for determining an absolute value of a difference signal and maximum value detecting means for receiving an absolute value signal as its input and detecting the maximum value thereof.

5. The evaluation system for a D-A converter according to claim 2, wherein the digital moving differentiator means further comprises: a period memory which stores the period of a sine wave being applied to the D-A converter; and a combination of absolute value calculating means for determining an absolute value of a difference signal, and maximum value detecting means for receiving an absolute value signal as its input and detecting a maximal value thereof in correspondence to the period of the sine wave.

6. The evaluation system for a D-A converter according to claim 1, wherein the waveform memory includes:
   a plurality of waveform memories for storing and accumulating the digital signal;
   selecting means for selecting a waveform memory which stores and accumulates therein a digital signal pattern corresponding to a cosine wave or a digital signal pattern corresponding to a sine wave; and
   read-out means for selecting a waveform memory to read out the digital signal stored and accumulated therein.

7. The evaluation system for a D-A converter according to claim 6, further comprising:
   a trigger circuit coupled to a write circuit for the waveform memory and generating a trigger signal under a specified condition of an input digital signal pattern; and control means for taking in a given quantity of digital signals on the basis of the trigger signal from the trigger circuit.

8. The evaluation system for a D-A converter according to claim 1, wherein the instantaneous amplitude calculation means comprises:

multiplication means for reading a plurality of digital signals from the waveform memory to derive a square signal of a digital signals corresponding to the cosine wave and a square signal of a digital signal corresponding to the sine wave;

adder means for adding a plurality of square signals to derive a square amplitude signal; and square root means for forming a square root of the square amplitude signal to determine an instantaneous amplitude signal.

9. The evaluation system for a D-A converter according to claim 1, wherein the digital moving differentiator means further comprises a combination of absolute value calculating means for determining an absolute value of a difference signal and maximum value detecting means for receiving an absolute value signal as its input and detecting the maximum value thereof.

10. The evaluation system for a D-A converter according to claim 1, wherein the digital moving differentiator means further comprises: a period memory which stores the period of a sine wave being applied to the D-A converter; and a combination of absolute value calculating means for determining an absolute value of a difference signal, and maximum value detecting means for receiving an absolute value signal as its input and detecting a maximal value thereof in correspondence to the period of the sine wave.

11. An evaluation system for a D-A converter comprising:

a pattern generator for generating a sine wave pattern in the form of a digital signal;

a timing controller for generating a clock which is used in supplying the sine wave pattern to a D-A converter under test;

an A-D converter having a higher accuracy of conversion than the D-A converter and operative to convert an analog signal outputted from the D-A converter to a digital signal;

a waveform memory for storing and accumulating a digital signal outputted from the A-D converter;

instantaneous amplitude calculation means for taking out a digital signal stored in the waveform memory therefrom and determining an instantaneous amplitude;

interleave signal producing means for receiving the instantaneous amplitude and the amplitude of the sine wave as its inputs and forming an interleave signal in which the instantaneous amplitude and the amplitude of the sine wave are interleaved; and Wavelet transform means for receiving the interleave signal as its input and applying a Wavelet transform to the interleave signal.

12. The evaluation system for a D-A converter according to claim 11, further comprising a digital signal selecting means for selecting and taking out from the waveform memory either a digital signal the applied signal pattern of which corresponds to a cosine wave or a digital signal the applied signal pattern of which corresponds to a sine wave.

13. The evaluation system for a D-A converter according to claim 12, wherein the instantaneous amplitude calculation means comprises:

multiplication means for reading a plurality of digital signals from the waveform memory to derive a square signal of a digital signals corresponding to the cosine wave and a square signal of a digital signal corresponding to the sine wave;

adder means for adding a plurality of square signals to derive a square amplitude signal; and square root means for forming a square root of the square amplitude signal to determine an instantaneous amplitude signal.

14. The evaluation system for a D-A converter according to claim 12, wherein the Wavelet transform means further comprises a combination of absolute value calculating means for determining an absolute value of a signal obtained as a result of the Wavelet transform, and maximum value detecting means for receiving an absolute value signal as its input and detecting the maximum value thereof.

15. The evaluation system for a D-A converter according to claim 12, wherein the Wavelet transform means further comprises: a period memory which stores the period of a sine wave being applied to the D-A converter; and a combination of absolute value calculating means for determining an absolute value of a signal obtained as a result of the Wavelet transform, and maximal value detecting means for receiving an absolute value signal as its input and detecting a maximal value thereof in correspondence to the period of the sine wave.

16. The evaluation system for a D-A converter according to claim 11, wherein the waveform memory includes:

a plurality of waveform memories for storing and accumulating the digital signal;

selecting means for selecting a waveform memory which stores and accumulates therein a digital signal pattern corresponding to a cosine wave or a digital signal pattern corresponding to a sine wave; and read-out means for selecting a waveform memory to read out the digital signal stored and accumulated therein.

17. The evaluation system for a D-A converter according to claim 16, further comprising:

a trigger circuit coupled to a write circuit for the waveform memory and generating a trigger signal under a specified condition of an input digital signal pattern; and control means for taking in a given quantity of digital signals on the basis of the trigger signal from the trigger circuit.

18. The evaluation system for a D-A converter according to claim 11, wherein the instantaneous amplitude calculation means comprises:

multiplication means for reading a plurality of digital signals from the waveform memory to derive a square signal of a digital signals corresponding to the cosine wave and a square signal of a digital signal corresponding to the sine wave;

adder means for adding a plurality of square signals to derive a square amplitude signal; and square root means for forming a square root of the square amplitude signal to determine an instantaneous amplitude signal.

19. The evaluation system for a D-A converter according to claim 11, wherein the Wavelet transform means further comprises a combination of absolute value calculating means for determining an absolute value of a signal obtained as a result of the Wavelet transform, and maximum value detecting means for receiving an absolute value signal as its input and detecting the maximum value thereof.

20. The evaluation system for a D-A converter according to claim 11, wherein the Wavelet transform means further comprises: a period memory which stores the period of a sine wave being applied to the D-A converter; and a combination of absolute value calculating means for determining an absolute value of a signal obtained as a result of the Wavelet transform, and maximal value detecting means for receiving an absolute value signal as its input and detecting a maximal value thereof in correspondence to the period of the sine wave.

21. A method for evaluating a D-A converter comprising:

generating a sine wave pattern having an amplitude in the form of a digital signal;

generating a clock which is used in supplying the sine wave pattern to a D-A converter under test;

applying an A-D converter having a higher accuracy of conversion than the D-A converter to convert an analog signal outputted from the D-A converter to a digital signal;

storing in a waveform memory a digital signal outputted from the A-D converter;

determining an instantaneous amplitude signal from a digital signal stored in the waveform memory;

forming an interleave signal in which the instantaneous amplitude and the amplitude of the sine wave are interleaved; and calculating a moving difference.

22. The method for evaluating a D-A converter according to claim 21, that further comprises obtaining from the waveform memory either a digital signal that corresponds to a cosine wave or a digital signal that corresponds to a sine wave.

23. The method for evaluating a D-A converter according to claim 22, wherein the act of determining an instantaneous amplitude comprises:

reading a plurality of digital signals from the waveform memory to derive a square signal of a digital signal corresponding to the cosine wave and a square signal of a digital signal corresponding to the sine wave;

adding a plurality of square signals to derive a square amplitude signal; and forming a square root of the square amplitude signal to determine an instantaneous amplitude signal.

24. The method for evaluating a D-A converter according to claim 22, wherein the act-of calculating a moving difference comprises: determining an absolute value of a difference signal, receiving an absolute value signal and detecting a maximum value thereof.

25. The method for evaluating a D-A converter according to claim 22, wherein the act of calculating a moving difference comprises: storing in a period memory a period of a sine wave being applied to the D-A converter, determining an absolute value of a difference signal, receiving an absolute value signal and detecting a maximum value thereof.

26. The method for evaluating a D-A converter according to claim 21, that further comprises:

storing the digital signal outputted from the A-D converter in a plurality of waveform memories;

selecting a waveform memory which stores therein a digital signal corresponding to a cosine wave or a digital signal corresponding to a sine wave; and reading out the digital signal stored in the waveform memory selected by the selecting means.

27. The method for evaluating a D-A converter according to claim 26, that further comprises:

generating a trigger signal in response to an input digital signal; and receiving a given quantity of digital signals on the basis of the trigger signal.

28. The method for evaluating a D-A converter according to claim 21, wherein the act of determining an instantaneous amplitude comprises:

reading a plurality of digital signals from the waveform memory to derive a square signal of a digital signal corresponding to the cosine wave and a square signal of a digital signal corresponding to the sine wave;

adding a plurality of square signals to derive a square amplitude signal; and forming a square root of the square amplitude signal to determine an instantaneous amplitude signal.

29. The method for evaluating a D-A converter according to claim 21, wherein the act of calculating a moving difference comprises: determining an absolute value of a difference signal, receiving an absolute value signal and detecting a maximum value thereof.

30. The method for evaluating a D-A converter according to claim 21, wherein the act of calculating a moving difference comprises: storing in a period memory a period of a sine wave being applied to the D-A converter, determining an absolute value of a difference signal, receiving an absolute value signal and detecting a maximum value thereof.

31. A method for evaluating a D-A converter comprising:

generating a sine wave pattern having an amplitude in the form of a digital signal;

generating a clock which is used in supplying the sine wave pattern to a D-A converter under test;

applying an A-D converter having a higher accuracy of conversion than the D-A converter to convert an analog signal outputted from the D-A converter to a digital signal;

storing a digital signal outputted from the A-D converter;

determining an instantaneous amplitude signal from a digital signal stored in the waveform memory;

forming an interleave signal in which the instantaneous amplitude and the amplitude of the sine wave are interleaved; and applying a Wavelet transform to the interleave signal.

32. The method for evaluating a D-A converter according to claim 31, that further comprises obtaining from the waveform memory either a digital signal that corresponds to a cosine wave or a digital signal that corresponds to a sine wave.

33. The method for evaluating a D-A converter according to claim 32, wherein the act of determining an instantaneous amplitude comprises:

reading a plurality of digital signals from the waveform memory to derive a square signal of a digital signal corresponding to the cosine wave and a square signal of a digital signal corresponding to the sine wave;

adding a plurality of square signals to derive a square amplitude signal; and forming a square root of the square amplitude signal to determine an instantaneous amplitude signal.

34. The method for evaluating a D-A converter according to claim 32, wherein the act of applying a Wavelet transform comprises: determining an absolute value of a signal obtained as a result of the Wavelet transform, receiving an absolute value signal and detecting a maximum value thereof.

35. The method for evaluating a D-A converter according to claim 32, wherein the act of applying a Wavelet transform comprises: storing in a period memory a period of a sine wave being applied to the D-A converter, determining an absolute value of a signal obtained as a result of the Wavelet transform, receiving an absolute value signal and detecting a maximum value thereof.

36. The method for evaluating a D-A converter according to claim 31, that further comprises:

storing the digital signal outputted from the A-D converter in a plurality of waveform memories;

selecting a waveform memory which stores therein a digital signal corresponding to a cosine wave or a digital signal corresponding to a sine wave; and reading out the digital signal stored in the waveform memory selected by the selecting means.

37. The method for evaluating a D-A converter according to claim 36, that further comprises:

generating a trigger signal in response to an input digital signal; and receiving a given quantity of digital signals on the basis of the trigger signal.

38. The method for evaluating a D-A converter according to claim 31, wherein the act of determining an instantaneous amplitude comprises:

reading a plurality of digital signals from the waveform memory to derive a square signal of a digital signal corresponding to the cosine wave and a square signal of a digital signal corresponding to the sine wave;

adding a plurality of square signals to derive a square amplitude signal; and forming a square root of the square amplitude signal to determine an instantaneous amplitude signal.

39. The method for evaluating a D-A converter according to claim 31, wherein the act of applying a Wavelet transform comprises: determining an absolute value of a signal obtained as a result of the Wavelet transform, receiving an absolute value signal and detecting a maximum value thereof.

40. The method for evaluating a D-A converter according to claim 31, wherein the act of applying a Wavelet transform comprises: storing in a period memory a period of a sine wave being applied to the D-A converter, determining an absolute value of a signal obtained as a result of the Wavelet transform, receiving an absolute value signal and detecting a maximum value thereof.

\* \* \* \* \*